United States Patent
Salmond et al.

(10) Patent No.: US 11,936,348 B2
(45) Date of Patent: Mar. 19, 2024

(54) IMPEDANCE ELEMENT WITH BUILT-IN ODD-MODE OSCILLATION SUPPRESSION

(71) Applicant: Telefonaktiebolaget LM Ericsson (publ), Stockholm (SE)

(72) Inventors: Rob Salmond, Nepean (CA); Carl Conradi, Ottawa (CA); Somsack Sychaleun, Ottawa (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 429 days.

(21) Appl. No.: 17/295,140

(22) PCT Filed: Mar. 20, 2019

(86) PCT No.: PCT/IB2019/052286
§ 371 (c)(1),
(2) Date: May 19, 2021

(87) PCT Pub. No.: WO2020/109873
PCT Pub. Date: Jun. 4, 2020

(65) Prior Publication Data
US 2022/0021355 A1 Jan. 20, 2022

Related U.S. Application Data

(60) Provisional application No. 62/773,403, filed on Nov. 30, 2018.

(51) Int. Cl.
*H03F 1/07* (2006.01)
*H01L 23/66* (2006.01)
(Continued)

(52) U.S. Cl.
CPC ............ *H03F 3/211* (2013.01); *H01L 23/66* (2013.01); *H03F 1/565* (2013.01); *H03F 3/195* (2013.01);
(Continued)

(58) Field of Classification Search
CPC ............... H03F 1/07; H03F 1/02; H03F 3/187
(Continued)

(56) References Cited

U.S. PATENT DOCUMENTS 5,111,157 A * 5/1992 Komiak ................. H03F 3/604
330/307
6,281,756 B1 * 8/2001 Goto ...................... H03F 3/604
330/295
(Continued)

FOREIGN PATENT DOCUMENTS

JP H09 139639 A 5/1997

OTHER PUBLICATIONS

International Search Report and Written Opinion dated Aug. 16, 2019 issued in PCT Application No. PCT/IB2019/052286, consisting of 13 pages.
(Continued)

*Primary Examiner* — Henry Choe
(74) *Attorney, Agent, or Firm* — Christopher & Weisberg, P.A.

(57) ABSTRACT

A transistor package for a power amplifier is provided. The transistor package includes a plurality of radio frequency, RF, paths that includes a first RF path and second RF path. Each RF path includes a transistor-carrying die and at least one impedance element. The transistor package includes a circuit portion electrically coupling a first impedance element in the first RF path to a second impedance element in the second RF path where the circuit portion includes at least one resistor.

22 Claims, 22 Drawing Sheets

(51) Int. Cl.
*H03F 1/56* (2006.01)
*H03F 3/195* (2006.01)
*H03F 3/21* (2006.01)
*H03F 3/24* (2006.01)

(52) U.S. Cl.
CPC ...... *H03F 3/245* (2013.01); *H01L 2223/6611* (2013.01); *H01L 2223/6672* (2013.01); *H03F 2200/222* (2013.01); *H03F 2200/387* (2013.01); *H03F 2200/451* (2013.01); *H03F 2203/21106* (2013.01)

(58) Field of Classification Search
USPC ...................................... 330/295, 124 R, 307
See application file for complete search history.

(56) References Cited

U.S. PATENT DOCUMENTS

| | | | |
|---|---|---|---|
| 6,970,040 B1* | 11/2005 | Dening | H03F 1/0277 |
| | | | 330/126 |
| 7,348,842 B2* | 3/2008 | Ichitsubo | H03F 3/24 |
| | | | 257/E25.031 |
| 9,838,056 B2* | 12/2017 | Wloczysiak | H04B 1/10 |
| 11,705,870 B2* | 7/2023 | Hue | H03F 1/0288 |
| | | | 330/295 |
| 2011/0204976 A1 | 8/2011 | Masuda | |
| 2016/0056765 A1* | 2/2016 | Kim | H03F 3/211 |
| | | | 330/295 |

OTHER PUBLICATIONS

Ronald G. Freitag, "A Unified Analysis of MMIC Power Amplifier Stability", Westinghouse Electric Corporation, Baltimore, MD; 1992 IEEE MTT-S Digest, consisting of 4 pages.

Communication Pursuant to Article 94(3) EPC issued in European Patent Application No. 19 721 750.8 dated Apr. 18, 2023, consisting of 10 pages.

* cited by examiner

IMPEDANCE ELEMENT WITH BUILT-IN ODD-MODE OSCILLATION SUPPRESSION

CROSS-REFERENCE TO RELATED APPLICATIONS

This application is a Submission Under 35 U.S.C. § 371 for U.S. National Stage Patent Application of International Application No.: PCT/IB2019/052286, filed Mar. 20, 2019 entitled "IMPEDANCE ELEMENT WITH BUILT-IN ODD-MODE OSCILLATION SUPPRESSION," which claims priority to U.S. Provisional Application No. 62/773,403, filed Nov. 30, 2018, entitled "METAL OXIDE SEMICONDUCTOR CAPACITOR/INTEGRATED PASSIVE DEVICE WITH BUILT-IN ODD-MODE OSCILLATION SUPPRESSION," the entireties of both of which are incorporated herein by reference.

TECHNICAL FIELD

The present disclosure relates to power amplifiers, and in particular, to metal oxide semiconductor capacitor/integrated passive devices (MOSCAP/IPD) with built-in odd mode oscillation suppression such as may be used in power amplifiers in circuits, for example, for wireless communication applications.

BACKGROUND

Radio Frequency (RF) power amplifiers used in cellular base stations are often required to output peak power levels exceeding 500 W. These power amplifiers, in turn, require transistors with large die periphery to provide the required power. For lower power applications, a transistor may require only a single die. However, for high power applications, two or more dies may often be used in a single package to meet the power requirements.

FIG. 1 illustrates a physical view of a typical package 10 configuration while FIG. 2 illustrates a corresponding circuit schematic view of FIG. 1. The transistor package 10 consists of two RF paths 12a and 12b (collectively referred to as RF path 12). Each RF path 12 consists of the die 14 along with one or more impedance elements 16a and 16b (collectively referred to as tuning element 16) on the input and possibly one impedance element 16 on the output. One or more impedance elements 16 may be one or more shunt tuning elements. These impedance elements 16 are typically either metal oxide semiconductor capacitors (MOSCAPs), metal-insulator-metal (MIM) capacitors or integrated passive devices (IPDs) where one or more impedance elements 16 may have a capacitance 15. These impedance elements 16 are connected with bond wires 18 having a bond wire inductance 17, which are also used to connect these impedance elements 16 to the input lead 20 and output lead 22 of the transistor package 10. In the example of FIG. 1, there is a single set of input and output leads 20, 22 that are shared by both RF paths 12.

FIG. 3 illustrates a similar transistor package 10 configuration to FIG. 1, but with each RF path 12 having its own set of input and output leads 20, 22. These leads 20, 22 are typically connected on the Printed Circuit Board (PCB) 11 as is shown in FIG. 3 where there may not be connections of leads inside package 10. FIG. 4 illustrates a corresponding circuit schematic view of FIG. 3.

The two parallel paths are used to amplify even-mode signals. Even-mode signals are those which have equal amplitude and phase at the combining and splitting points of the parallel paths, as shown in FIG. 5. However, with two or more paths connected in parallel, there is a chance for an odd-mode signal to exist. An odd-mode signal is that which has equal amplitude but opposite phase at the combining and splitting points of the two parallel paths, which is shown in FIG. 6. Because the two odd-mode components are always the exact opposite of one another at the splitting and combining nodes, there is formed a virtual short at these points.

Under certain gain and feedback conditions in the transistors, there can be an odd mode oscillation between the two paths. This odd mode oscillation may degrade the performance of the power amplifier (PA) and may even cause damage to the transistor or other components used in the power amplifier.

A common solution to prevent odd-mode oscillation is to add a damping resistor between the two RF paths 12. This resistor introduces loss to any odd-mode signal content, since the opposite phases of the signal components will set up a potential difference across the resistor. If the value and location of the resistor are selected correctly, this loss can eliminate the conditions that would lead to odd-mode oscillation. Note that, since the even mode signal components are in phase, there is no even-mode potential difference across the resistors, so this resistor does not introduce loss to the even mode signal.

The damping resistor 24 can be added within the odd-mode loop, including the input and output sides of the die 14. Multiple resistors 24a-24b (collectively referred to as resistor 24 and/or dampening resistor 24) can be added if needed. In general, the damping resistors 24 are added as close to the die as possible. This will allow the damping resistor 24 to be effective over as broad a frequency range as possible. Some dies 14 have built-in resistors 24 on the input and/or output, along with separate bonding pads for this very purpose. FIG. 7 illustrates this. FIG. 8 illustrates a corresponding circuit schematic view of FIG. 7.

In other situations, dies 14 with built-in resistors 24 and extra bonding pads may not be available. In this case, a damping resistor 24, i.e., odd-mode resistor, can be added on the printed circuit board (PCB) 11, outside of the transistor package, as shown in FIG. 9, which may require that the transistor package 10 have separate input and output leads for each RF path 12. And it may not be as effective as a solution with damping resistor 24 located closer to the die 14. FIG. 10 illustrates a corresponding circuit schematic view of FIG. 9.

SUMMARY

Some embodiments advantageously provide metal oxide semiconductor capacitor/integrated passive devices (MOSCAP/IPD) with built-in odd mode oscillation suppression. The proposed solution presented herein is relevant to various types of packages, as described herein.

Some embodiments are based on the augmented package where the MOSCAPs and/or IPDs are used as impedance matching elements inside the transistor package by including damping resistors and/or additional bonding pads for connecting the two RF paths together, as described herein.

A single MOSCAP, MIMCAP or IPD can also be implemented with a capacitor to avoid the use of bond-wires bridging between the two caps and to reduce the count of physical elements within the package, as described herein. These and other embodiments are described in more detail below.

According to one aspect of the disclosure, a transistor package for a power amplifier is provided. The transistor package includes a plurality of radio frequency, RF, paths that includes a first RF path and second RF path. Each RF path includes a transistor-carrying die and at least one impedance element. The transistor package includes a circuit portion electrically coupling a first impedance element in the first RF path to a second impedance element in the second RF path where the circuit portion includes at least one resistor.

According to one or more embodiments of this aspect, the at least one resistor is configured to suppress odd mode signal components associated with the first and second RF paths. According to one or more embodiments of this aspect, the at least one resistor includes at least a first resistor and a second resistor. The first resistor is electrically coupled to the first impedance element. The second resistor is electrically coupled to the second impedance element, and the first and second resistors are electrically coupled to each other. According to one or more embodiments of this aspect, the at least one resistor includes at least a first resistor and a second resistor. The first resistor is integrated with the first impedance element and the second resistor is integrated with the second impedance element, and the first and second resistors are electrically coupled to each other.

According to one or more embodiments of this aspect, the circuit portion includes at least one of at least one reactive element and at least one transmission line. According to one or more embodiments of this aspect, the circuit portion includes an inductive element. The first resistor is electrically coupled to the second resistor by the inductive element. According to one or more embodiments of this aspect, the circuit portion electrically couples the first impedance element in the first RF path to the second impedance element in the second RF path using at least one bonding wire.

According to one or more embodiments of this aspect, the circuit portion includes a capacitor where the first resistor and second resistor are electrically coupled to ground by the capacitance. According to one or more embodiments of this aspect, the circuit portion includes a capacitor where the capacitor electrically couples the first impedance element in the first RF path to the second impedance element in the second RF path. According to one or more embodiments of this aspect, the impedance element is one of a Metal Oxide Semiconductor Capacitor, MOSCAP, Metal Insulator Metal Capacitor, MIMCAP, and an Integrated Passive Device, IPD. According to one or more embodiments of this aspect, the first RF path has an input and output that are separate from an input and output of the second RF path. According to one or more embodiments of this aspect, the at least one impedance element corresponds to a plurality of impedance element. According to one or more embodiments of this aspect, the plurality of RF paths include at least one RF path in addition to the first and second RF paths.

According to another aspect of the disclosure, a power amplifier is provided. The power amplifier includes a printed circuit board and a transistor package disposed on the printed circuit board. The transistor package includes a first radio frequency, RF, path that includes: a first transistor-carrying die and at least a first impedance element. The transistor package includes a second RF path including a second transistor-carrying die and at least a second impedance element. The transistor package includes a circuit portion electrically coupling the first impedance element in the first RF path to the second impedance element in the second RF path where the circuit portion includes at least one resistor.

According to one or more embodiments of this aspect, the at least one resistor is configured to suppress odd mode signal components associated with the first and second RF paths. According to one or more embodiments of this aspect, the at least one resistor includes at least a first resistor and a second resistor where the first resistor is electrically coupled to the first impedance element and the second resistor is electrically coupled to the second impedance element, and the first and second resistors are electrically coupled to each other. According to one or more embodiments of this aspect, the at least one resistor includes at least a first resistor and a second resistor where the first resistor is integrated with the first impedance element and the second resistor is integrated with the second impedance element, and the first and second resistors are electrically coupled to each other.

According to one or more embodiments of this aspect, the circuit portion includes at least one of: at least one reactive element and at least one transmission line. According to one or more embodiments of this aspect, the circuit portion includes an inductive element where the first resistor is electrically coupled to the second resistor by the inductive element. According to one or more embodiments of this aspect, the circuit portion electrically couples the first impedance element in the first RF path to the second impedance element in the second RF path using at least one bonding wire.

According to one or more embodiments of this aspect, the circuit portion includes a capacitor where the first resistor and second resistor are electrically coupled to ground by the capacitance. According to one or more embodiments of this aspect, the circuit portion includes a capacitor where the capacitor electrically couples the first impedance element in the first RF path to the second impedance element in the second RF path. According to one or more embodiments of this aspect, the impedance element is one of a Metal Oxide Semiconductor Capacitor, MOSCAP, Metal Insulator Metal Capacitor, MIMCAP, and an Integrated Passive Device, IPD. According to one or more embodiments of this aspect, the first RF path has an input and output that are separate from an input and output of the second RF path. According to one or more embodiments of this aspect, the at least one impedance element corresponds to a plurality of impedance element.

According to another aspect of the disclosure, a power amplifier is provided. The power amplifier includes a printed circuit board and a transistor package disposed on the printed circuit board. The transistor package includes a first radio frequency, RF, path that includes a first transistor-carrying die and at least a first impedance element separate from the first transistor-carrying die. The transistor package includes a second RF path that includes a second transistor-carrying die and at least a second impedance element separate from the second transistor-carrying die. The transistor package includes a circuit portion electrically coupling the first impedance element in the first RF path to the second impedance element in the second RF path. The circuit portion includes at least one dampening resistor configured to suppress odd mode signal components in the power amplifier. The first and second impedance elements are one of a Metal Oxide Semiconductor Capacitor, MOSCAP, Metal Insulator Metal Capacitor, MIMCAP, and an Integrated Passive Device, IPD.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
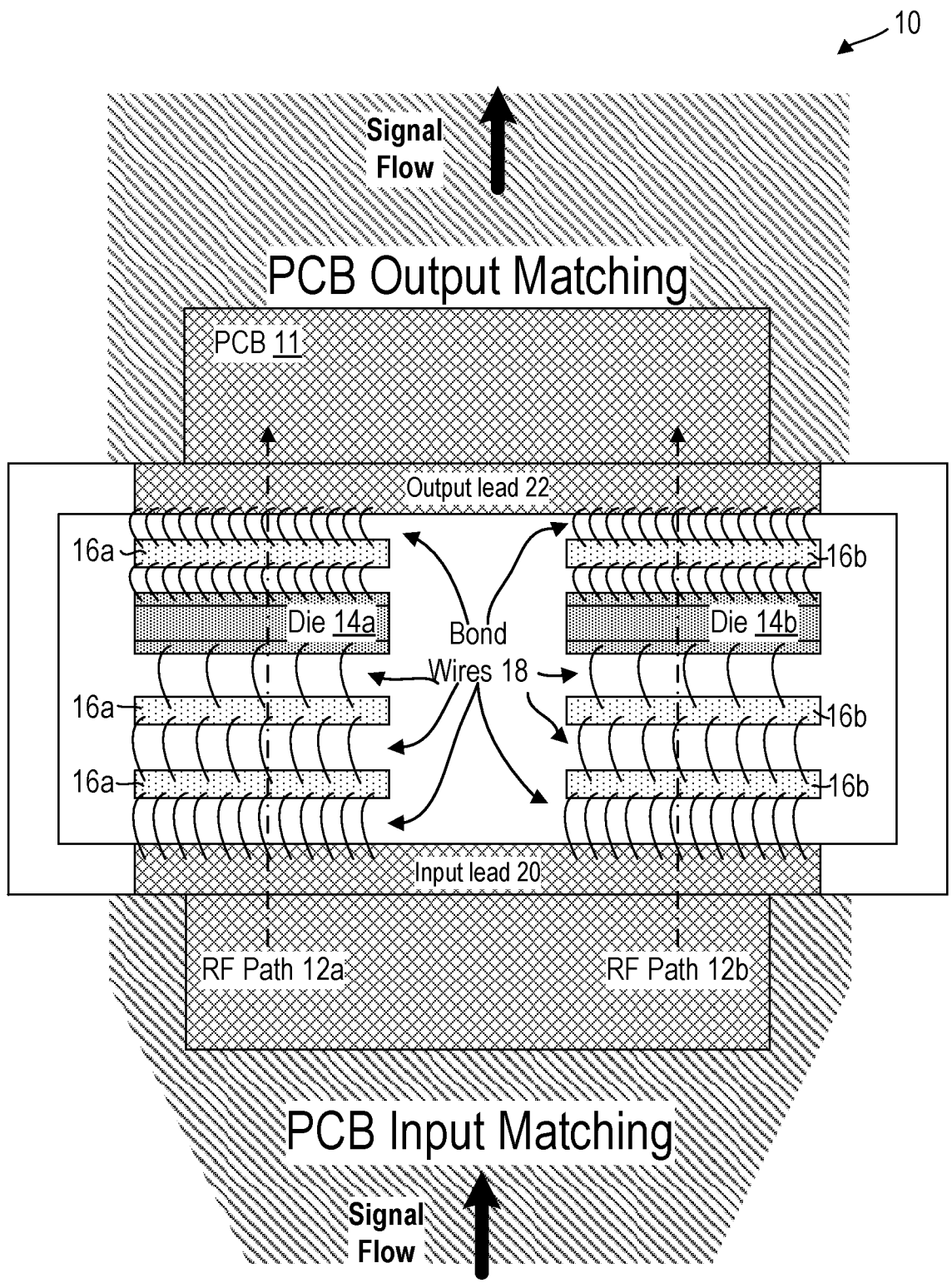
FIG. 1 shows a physical view of a typical package configuration.
Figure 2:
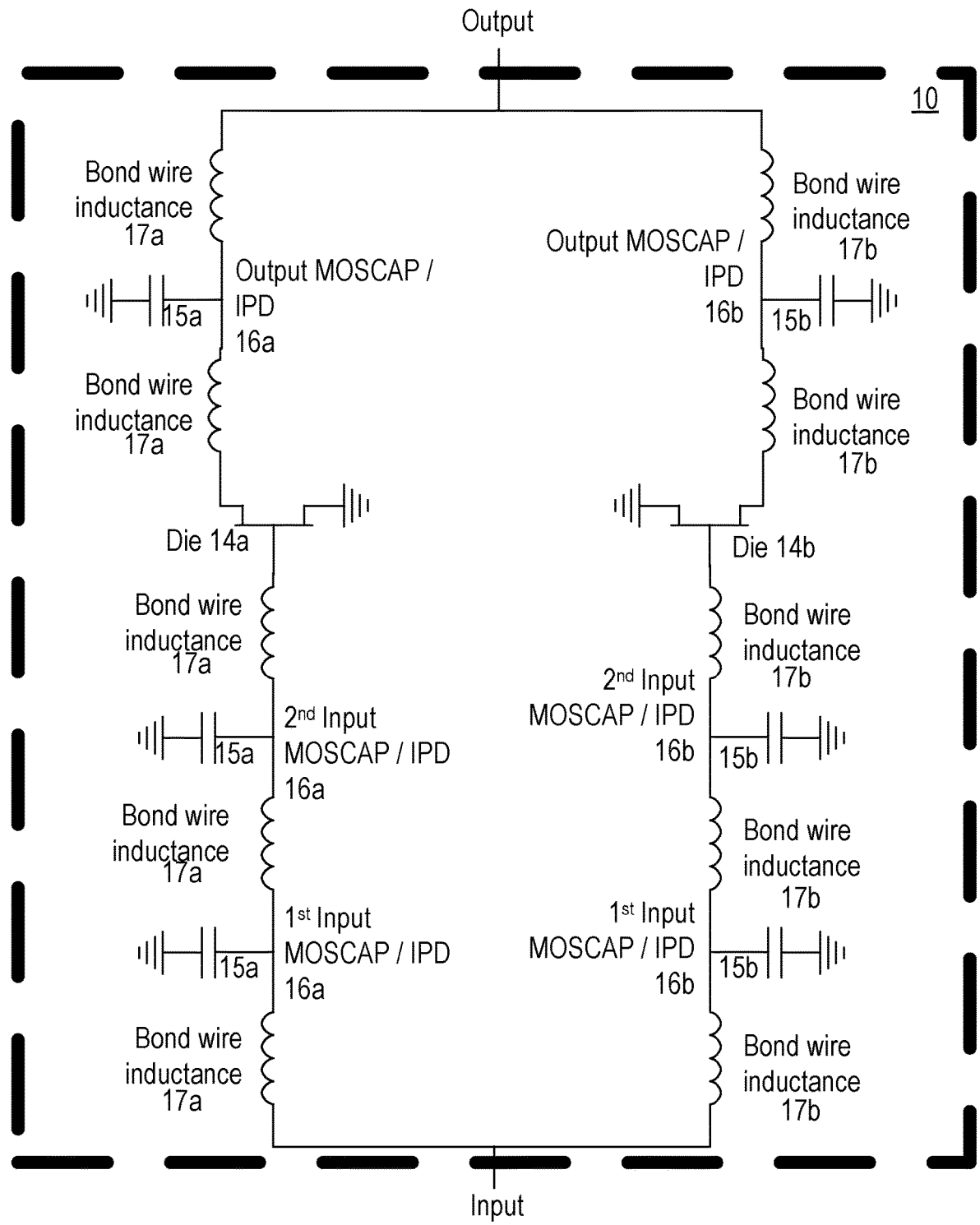
FIG. 2 shows a circuit schematic view of the package configuration of FIG. 1.
Figure 3:
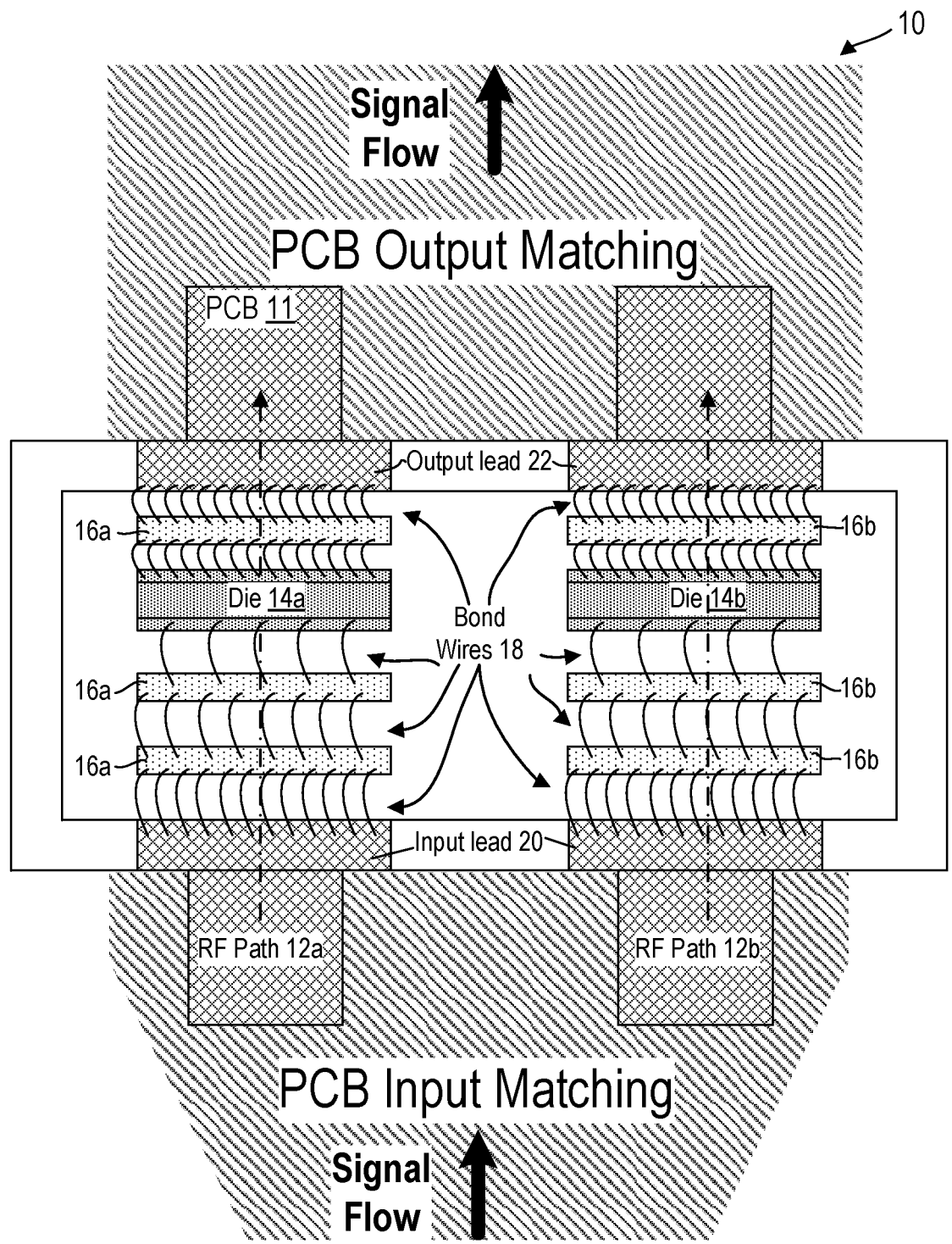
FIG. 3 shows a typical package configuration with each RF path having its own set of input and output leads.
Figure 4:
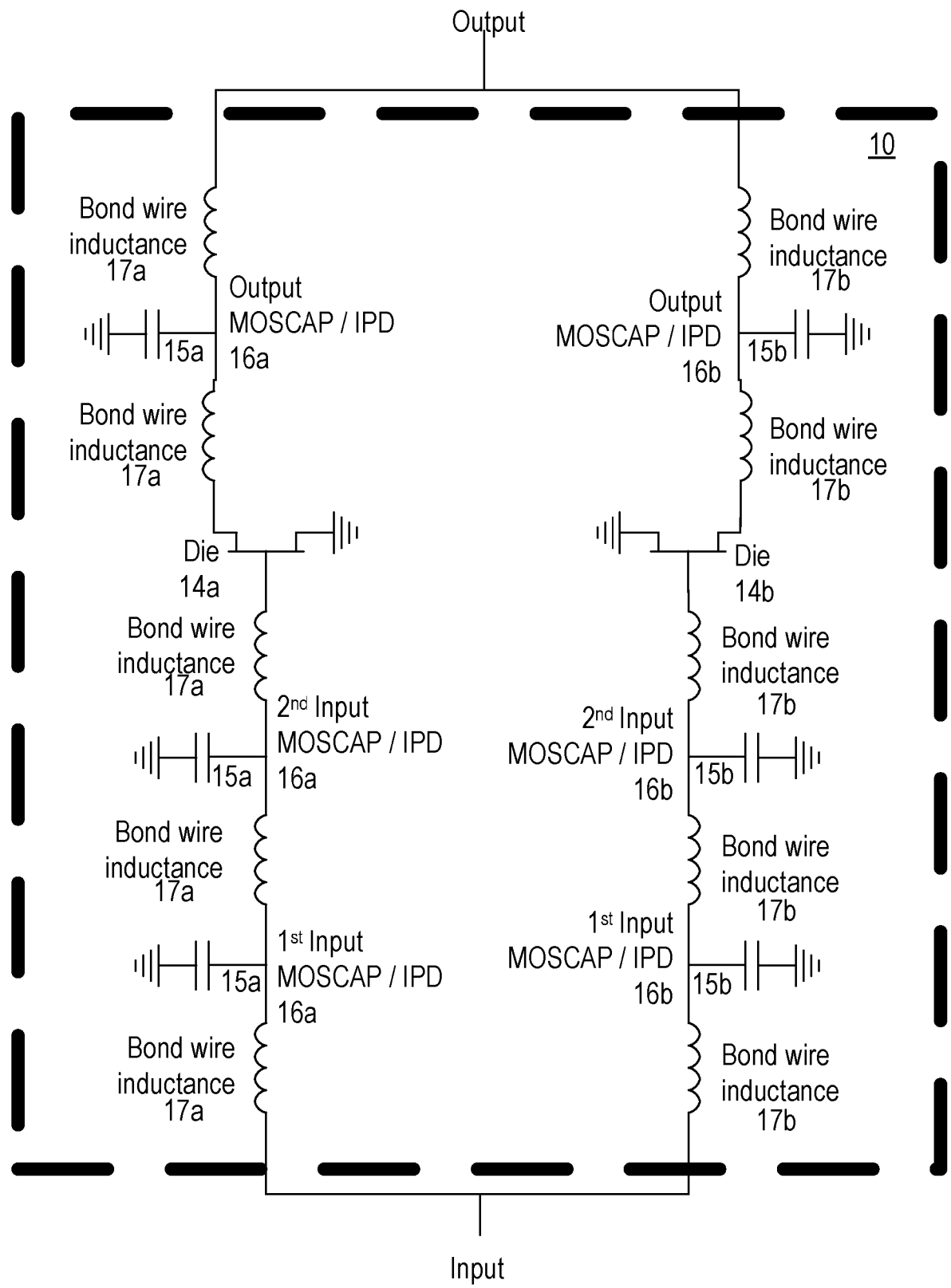
FIG. 4 is a circuit schematic view of the package configuration of FIG. 3.
Figure 5:
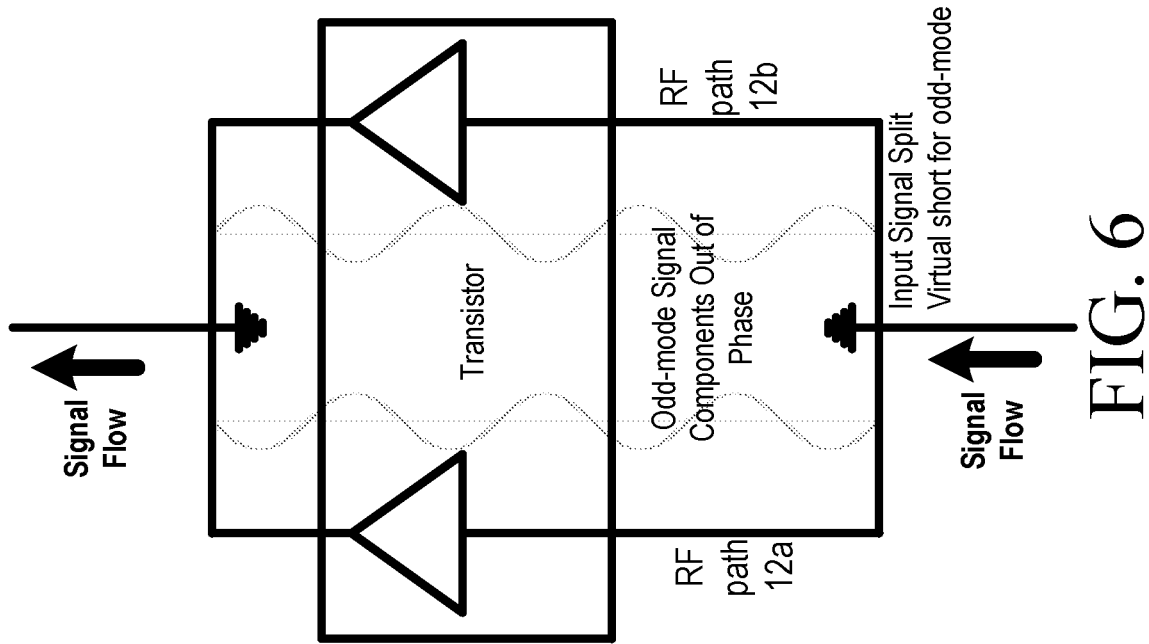
FIG. 5 shows an even mode signal.
Figure 6:
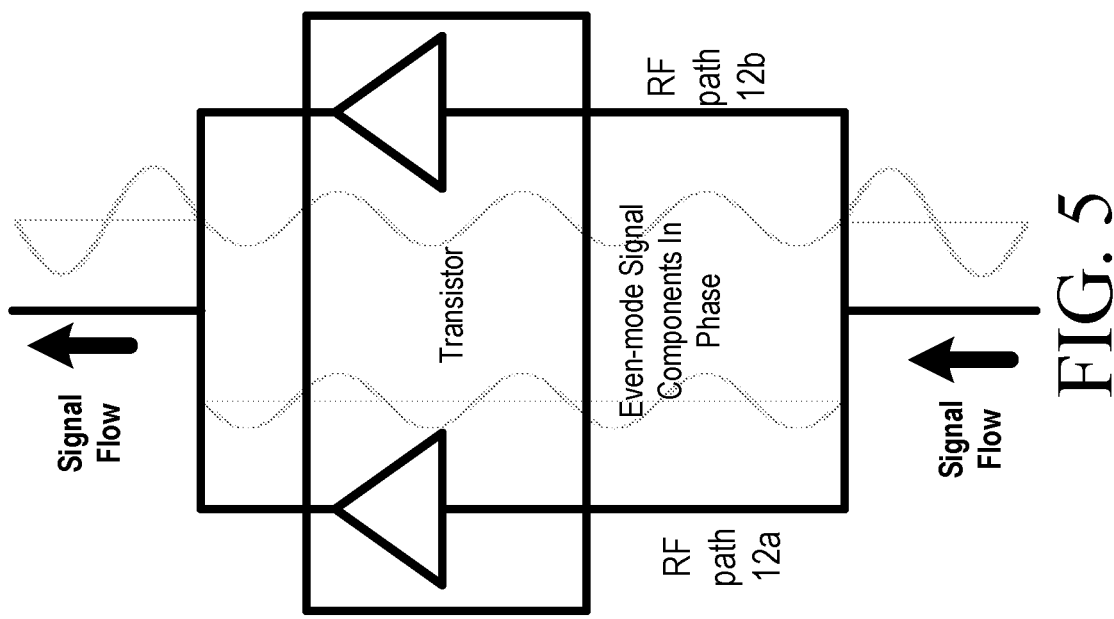
FIG. 6 shows an odd mode signal.
Figure 7:
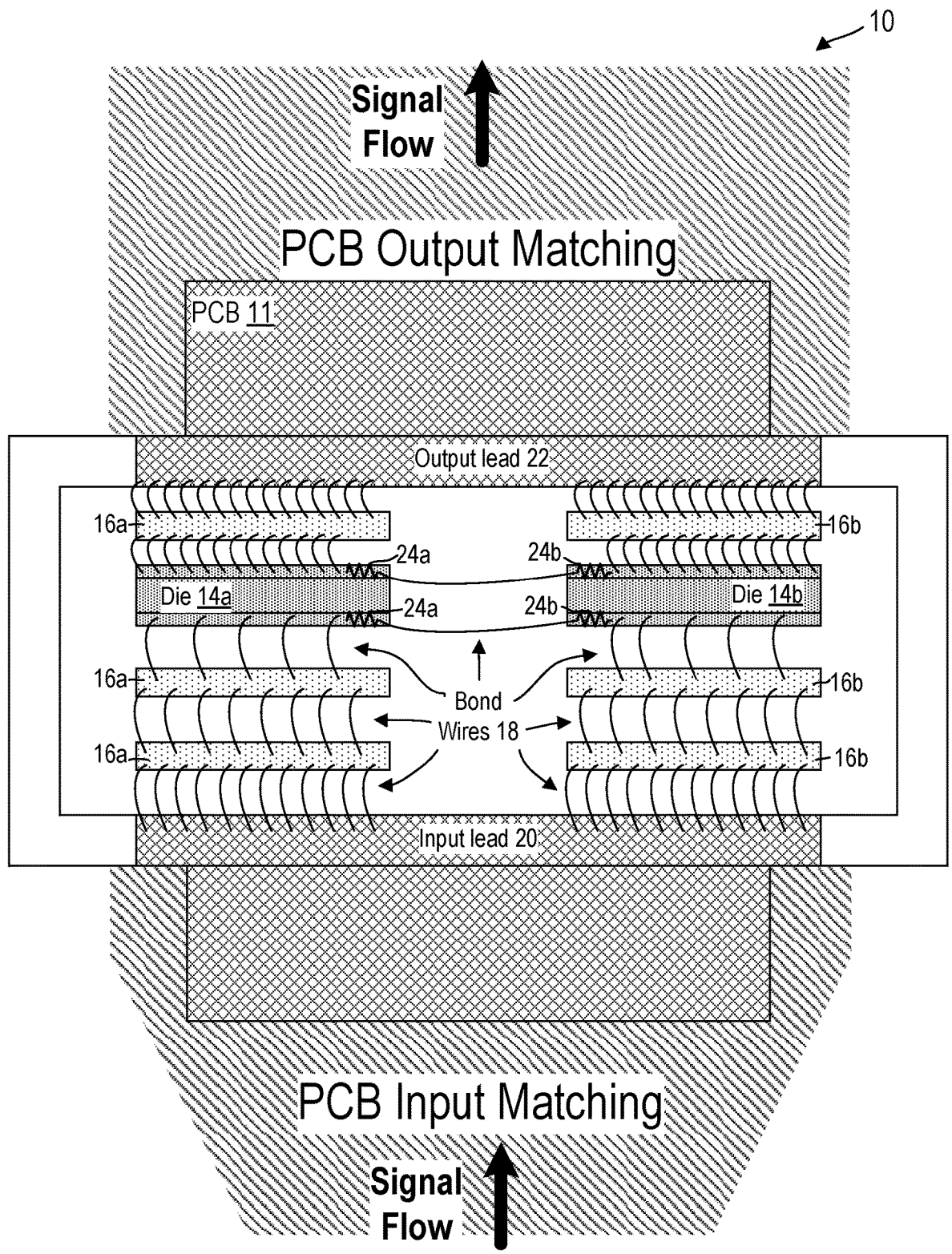
FIG. 7 shows a package configuration having dies with built-in resistors.
Figure 8:
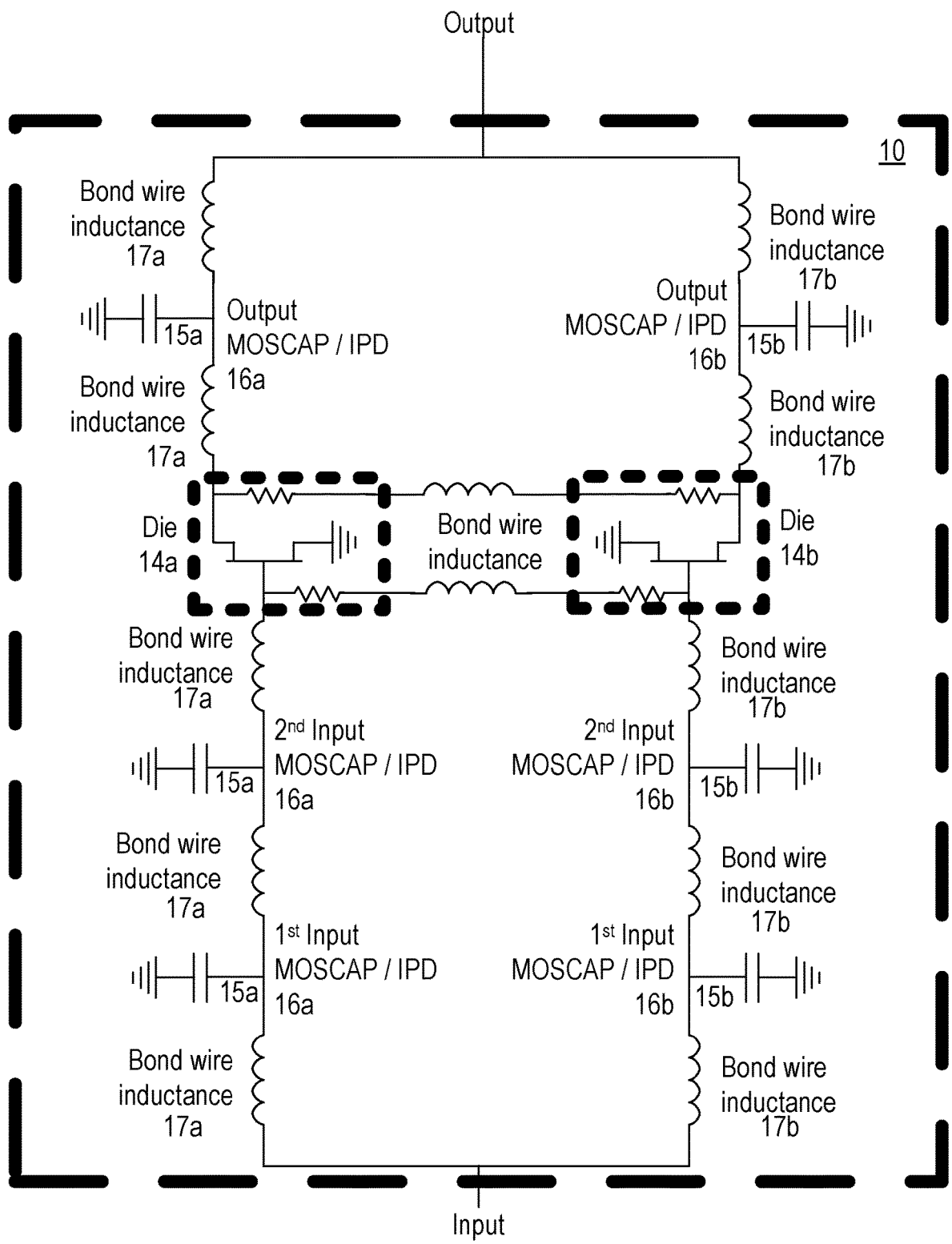
FIG. 8 shows a circuit schematic view of the package configuration of FIG. 7.
Figure 9:
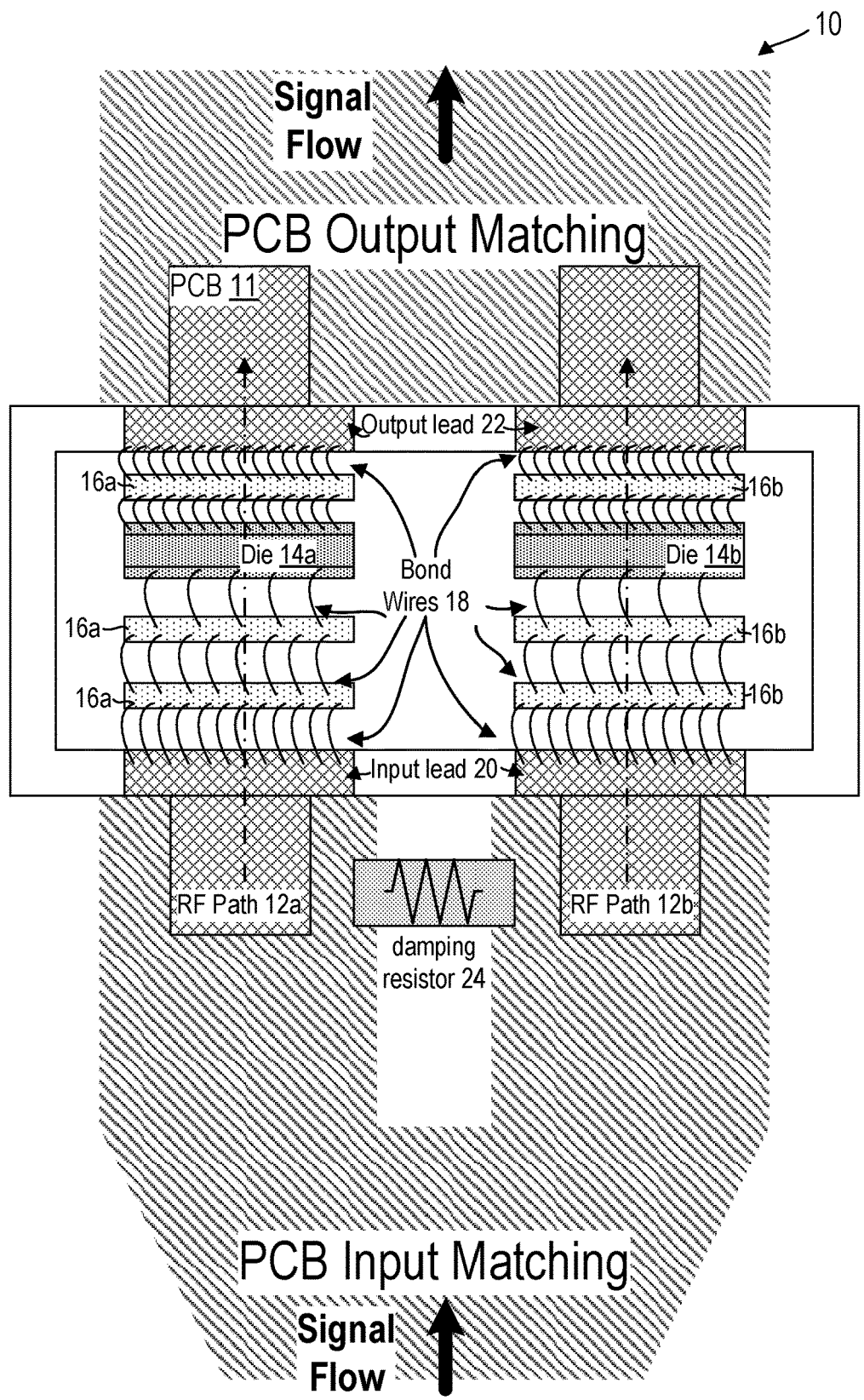
FIG. 9 shows a package configuration having a damping resistor added to the printed circuit board.
Figure 10:
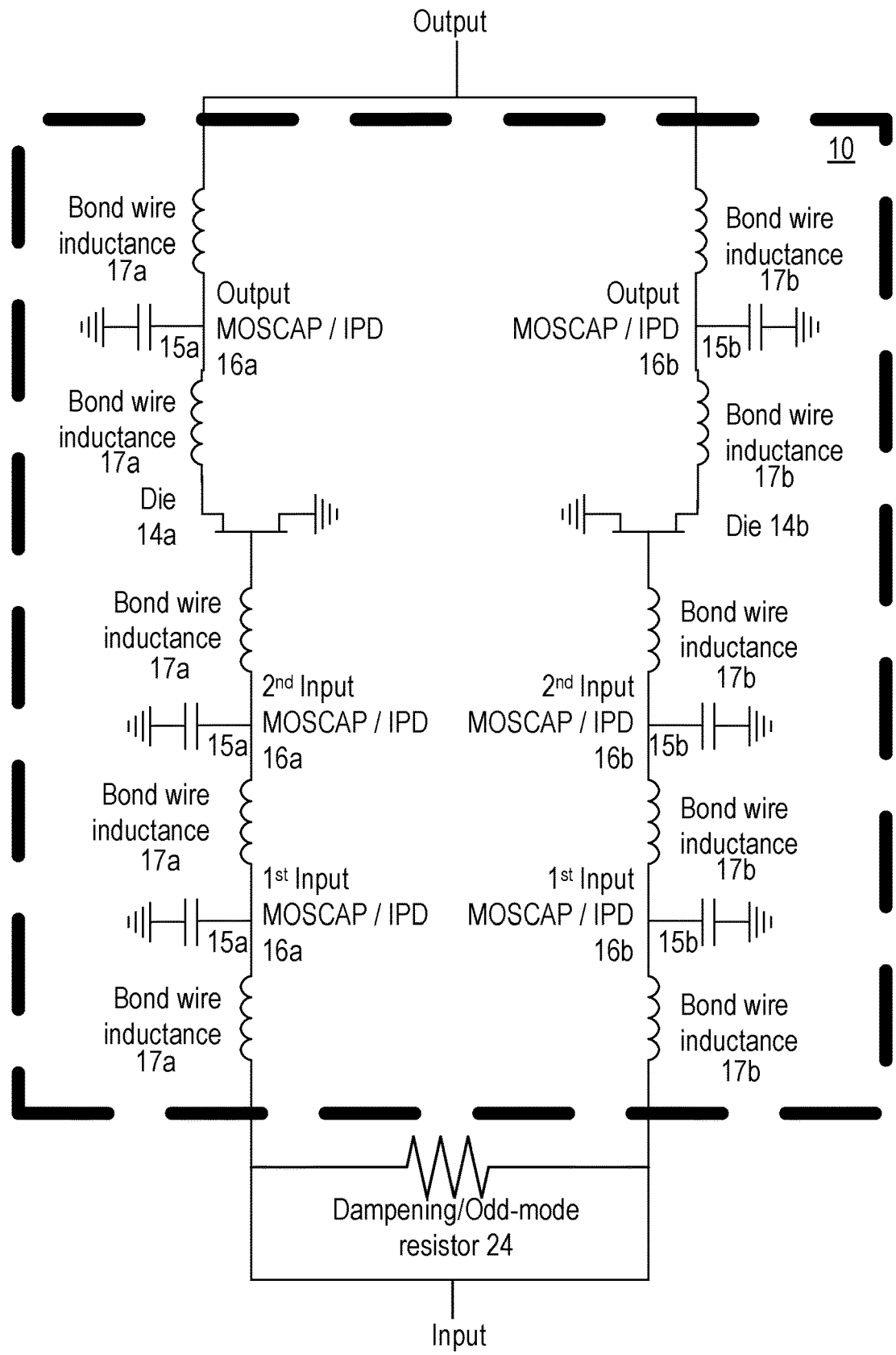
FIG. 10 shows a circuit schematic view of the package configuration of FIG. 9.

Before describing in detail exemplary embodiments, it is noted that the embodiments reside primarily in combinations of apparatus components and processing steps related to one or more impedance elements, e.g., metal oxide semiconductor capacitor/integrated passive devices (MOSCAP/IPD), with built-in odd mode oscillation suppression. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein. Like numbers refer to like elements throughout the description. For ease of illustration, while the same reference designators represent the same elements, these same elements may or may not have the same one or more characteristics such as values. For example, at least some impedance elements 16*a* (discussed below) may or may not have the same characteristics such as with respect to capacitance, etc. In another example, at least some resistors 24*a* (discussed below) may or may not have the same characteristics such as with respect to a resistance value, i.e., may correspond to the same resistance values in some embodiments or may correspond to one or more different resistance values in some embodiments. In yet another example, at least some inductive elements such as bondwires may or may not have the same characteristics, i.e., inductance value.

As used herein, in one or more embodiments, an impedance element is a passive component, specifically added to tune (or modify) the impedance that the transistor presents at and/or provides to the inputs/outputs of the package and/or from the package plane to the active die. The impedance element may corresponds to one or more base tuning components such as one or more of capacitors, inductors, resistors, transmission lines, a combination of transmission lines, etc.

As used herein, in one or more embodiments, an integrated passive device (IPD) refers to an integrated circuit (IC) implementation of an impedance element. The IPD includes one or more base tuning components such as one or more capacitors, inductors, resistors, transmission lines, a combination of transmission lines, etc. A substrate of an IPD can be composed of one or more of silicon, GaAs, GaN, etc As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections. For example, saying that one element is coupled to another element means that the two elements are directly physically connected and/or coupled via at least a third element.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments provide incorporating odd-mode suppression into the matching elements, i.e., impedance elements, of a multi-die transistor. In one or more embodiments, these impedance elements may be one or more of integrated passive devices (IPDs), metal-insulator-metal capacitors (MIMCAPs) and metal oxide semiconductor capacitors (MOSCAPs), which are connected to the transistor leads and the die with bond wires, for example. A transistor normally includes one or more of these impedance elements on its input and one or possibly none on its output. The disclosure herein is suitable for any multi-die transistor that has at least one IPD, MIMCAP or MOSCAP tuning element, i.e., impedance element, per die.

Figure 11:
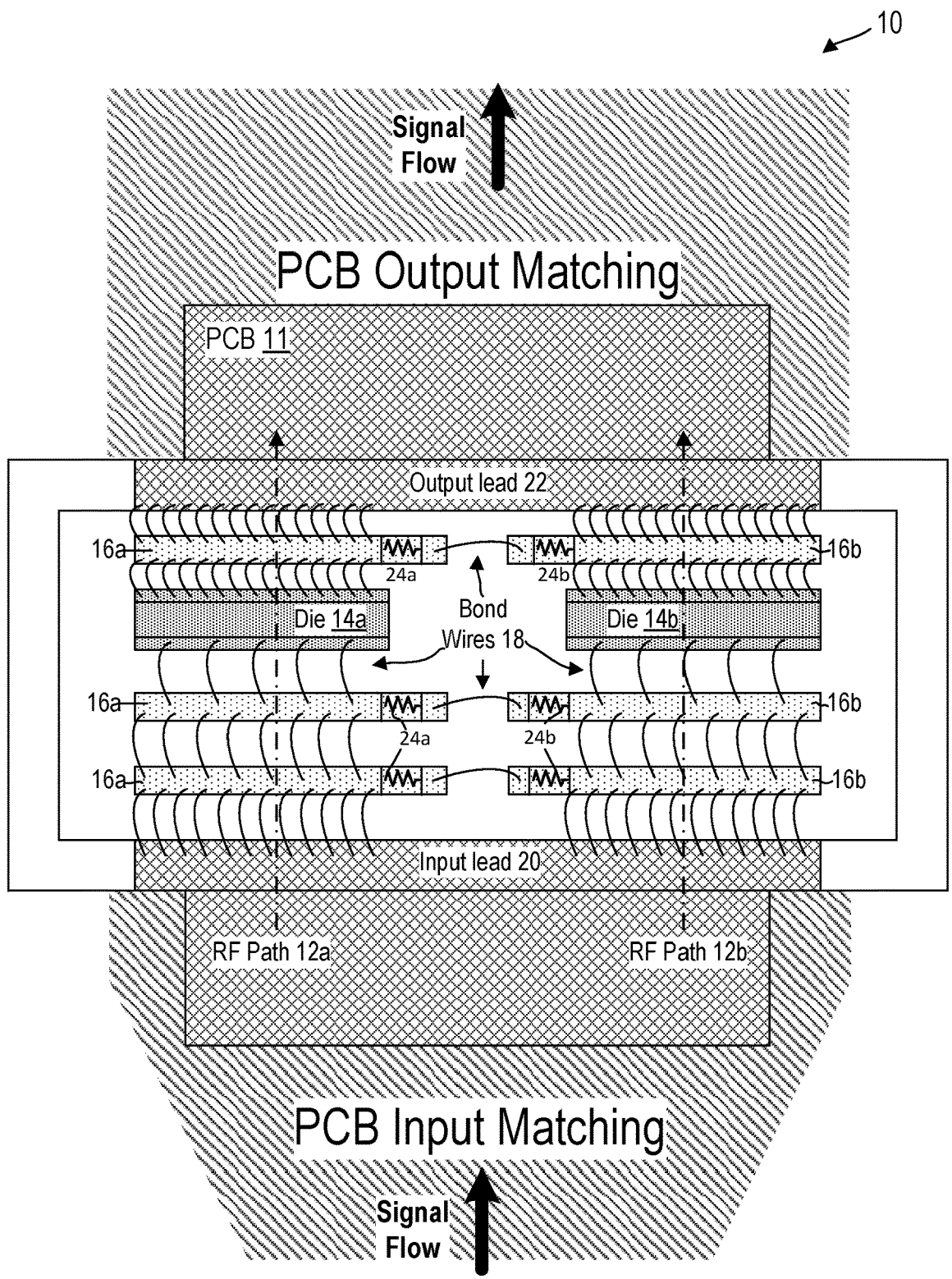
FIG. 11 shows one example of a package configuration having impedance matching networks augmented by at least one resistor in accordance with the principles of the disclosure.
Figure 12:
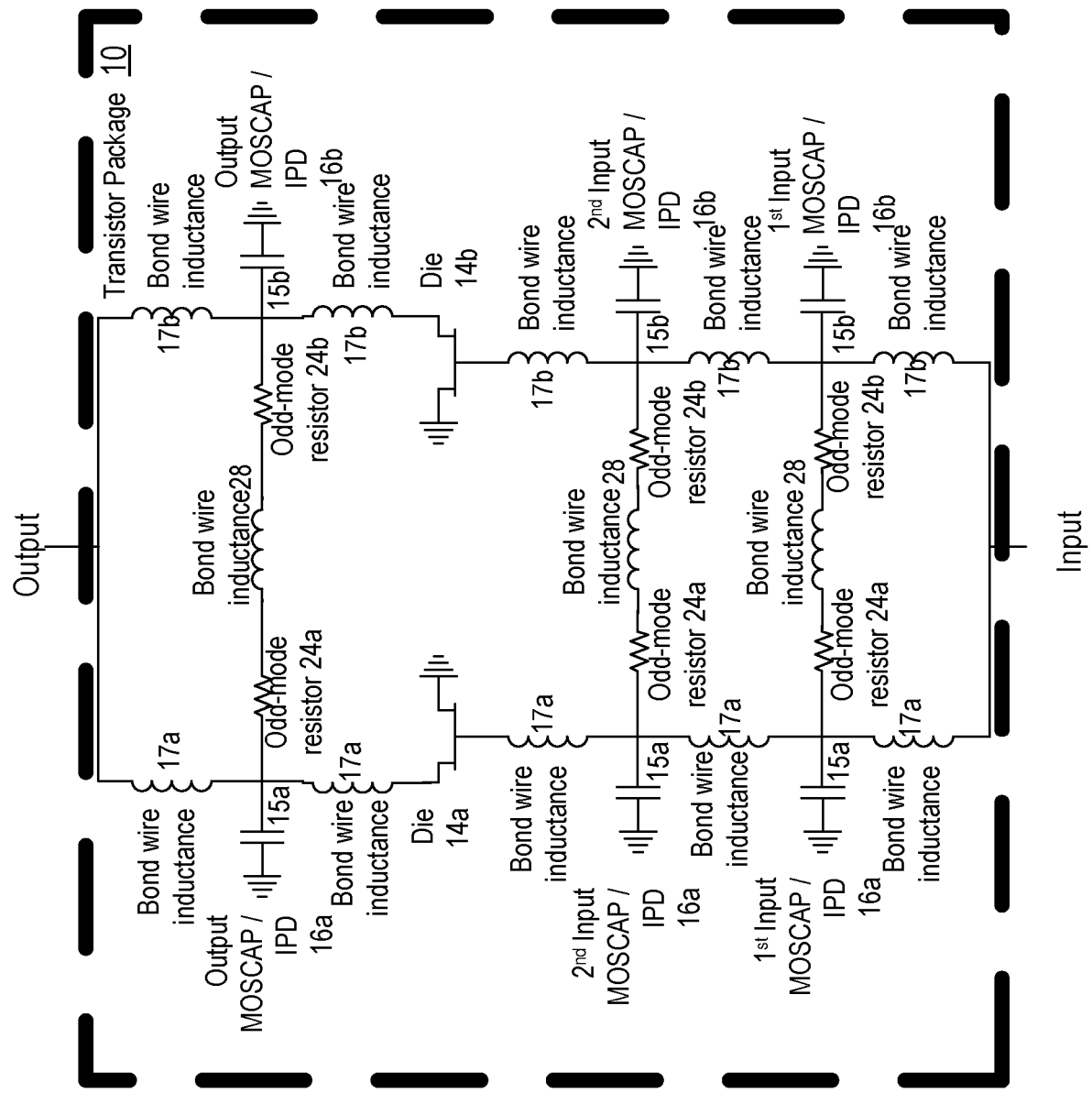
FIG. 12 is a circuit schematic view of the package configuration of FIG. 11 in accordance with the principles of the disclosure.

Referring again to the drawing figures, in which like elements are referred to by like reference numerals, there is shown in FIG. 11 an example of a transistor package 10 that is configured to provide odd-mode damping using at least one impedance element 16 such as one or more of the MOSCAPs, MIMCAPs or IPDs. The circuit schematic view of FIG. 11 is illustrated in FIG. 12. Referring back to FIG. 11, the transistor package 10 may include a single input lead and a single output lead. Between these leads are two RF paths 12, each having two input impedance elements 16 (i.e., shunt matching elements such as $1^{st}$ input MOSCAP/IPD and $2^{nd}$ input MOSCAP/IPD), a die 14 and an impedance element 16 (i.e., shunt matching element such as output MOSCAP/IPD). In one or more embodiments, one or more impedance elements 16 are one or more shunt matching elements. For each of one or more of these impedance elements 16, a first odd mode resistor 24a is coupled to one of the impedance elements 16 in one RF path 12 and a second odd mode resistor 24b is coupled to another of the impedance elements 16 in the other RF path 12. Resistor 24 may generally provide a resistance such that a first resistor 24a may provide a first resistance. The resistors 24a and 24b may be coupled through a bond wire 18 where the bond wire has an inductance 28. In one or more embodiments, resistor 24a is coupled to a corresponding resistor 24b as illustrated in FIG. 11, i.e., resistors 24a and 24b associated with like impedance elements 16 are coupled together.

Figure 19:
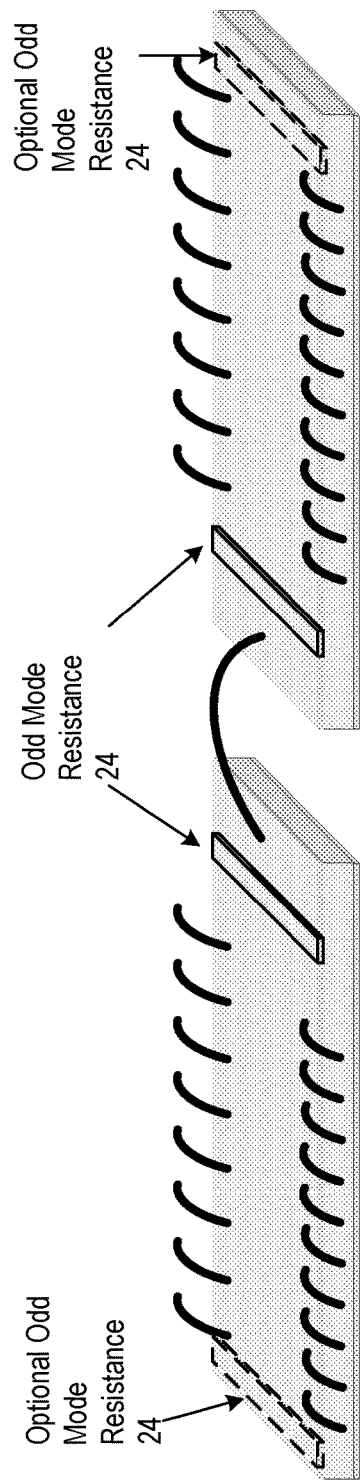
FIG. 19 is a physical view of the tuning element incorporated within an impedance network in accordance with the principles of the disclosure.

The resistors 24a and 24b and a bond-pad may be built-in to a respective one of the impedance elements 16 on the inner sides of the impedance elements 16. This allows for use of a short bonding wire 18, giving rise to the bond wire inductance 28, to be used to connect the MOSCAPs, MIMCAPs or IPDs from opposite sides through the resistors 24a and 24b. In one or more embodiments, additional resistors 24 may be included where the resistors 24 may be positioned in different locations of impedance element 16 such as proximate the edges of impedance element 16 as illustrated in FIG. 19, for example. As used herein, resistor 24 and resistance 24 may be used interchangeably.

Any odd-mode signal within this device may exist on both RF paths 12 within the transistor package 10, but with opposite phase. This results in a potential difference between common points on either RF path 12. The insertion of the resistors 24a and 24b between the RF paths 12 results in dissipation of this odd-mode signal, which dampens the potential for odd mode oscillation. In one or more embodiments, there are one or more impedance/tuning elements at the output, i.e., output lead 22, of one or more RF paths 12. Further, while only two RF paths 12 are illustrated in FIG. 11, one or more embodiments described herein with respect to any of FIGS. 11-28 may include N RF paths where N is an integer greater than 2, for example. Further, in one or more embodiments, the transistor package 10 may include up to N RF paths 12, each including a transistor-carrying die and at least one impedance element 16. For example, a circuit portion may connect one of the impedance elements 16 in the $2^{nd}$ RF path 12 to one of the impedance elements 16 in the $3^{rd}$ RF path 12. In other words, a circuit portion may connect one of the impedance elements 16 in the N–1th RF path 12 to one of the impedance elements 16 in the Nth RF path 12.

Figure 13:
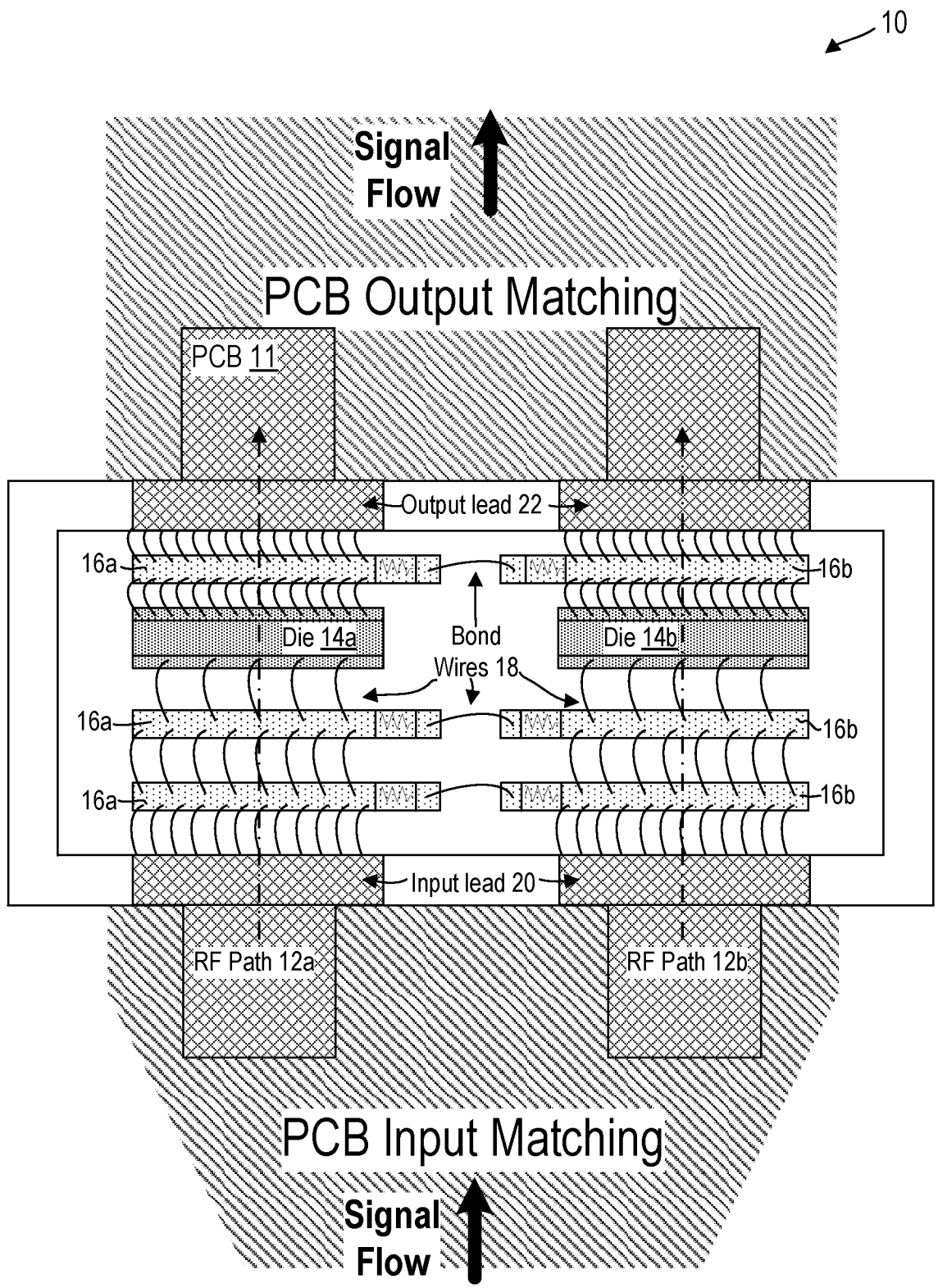
FIG. 13 is another example of a package configuration having separate input and output leads for the two RF paths in accordance with the principles of the disclosure.
Figure 14:
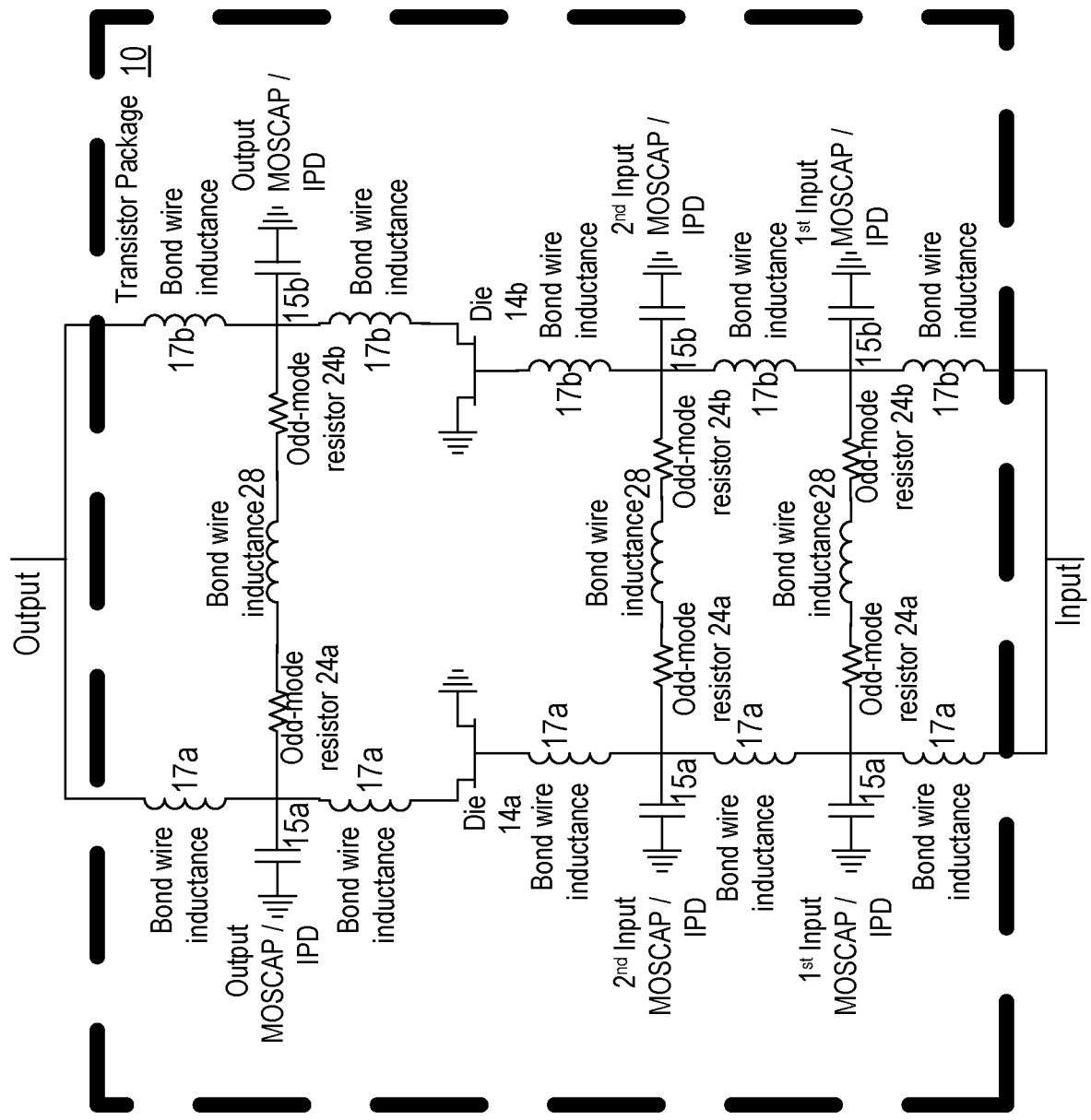
FIG. 14 is a circuit schematic view of the package configuration of FIG. 13 in accordance with the principles of the disclosure.

FIG. 13 is a diagram showing an example of a similar application of the solution described herein. However, the transistor package 10 shown in FIG. 13 has two sets of input leads 20 and output leads 22, one for each of the RF paths 12. The circuit schematic view of FIG. 13 is illustrated in FIG. 14. In both FIG. 11 and FIG. 13, all three impedance elements 16, are shown with the odd-mode resistors 24a and 24b. However, in some embodiments, only one or two of these impedance elements 16 may use this extra resistor 24.

Figure 15:
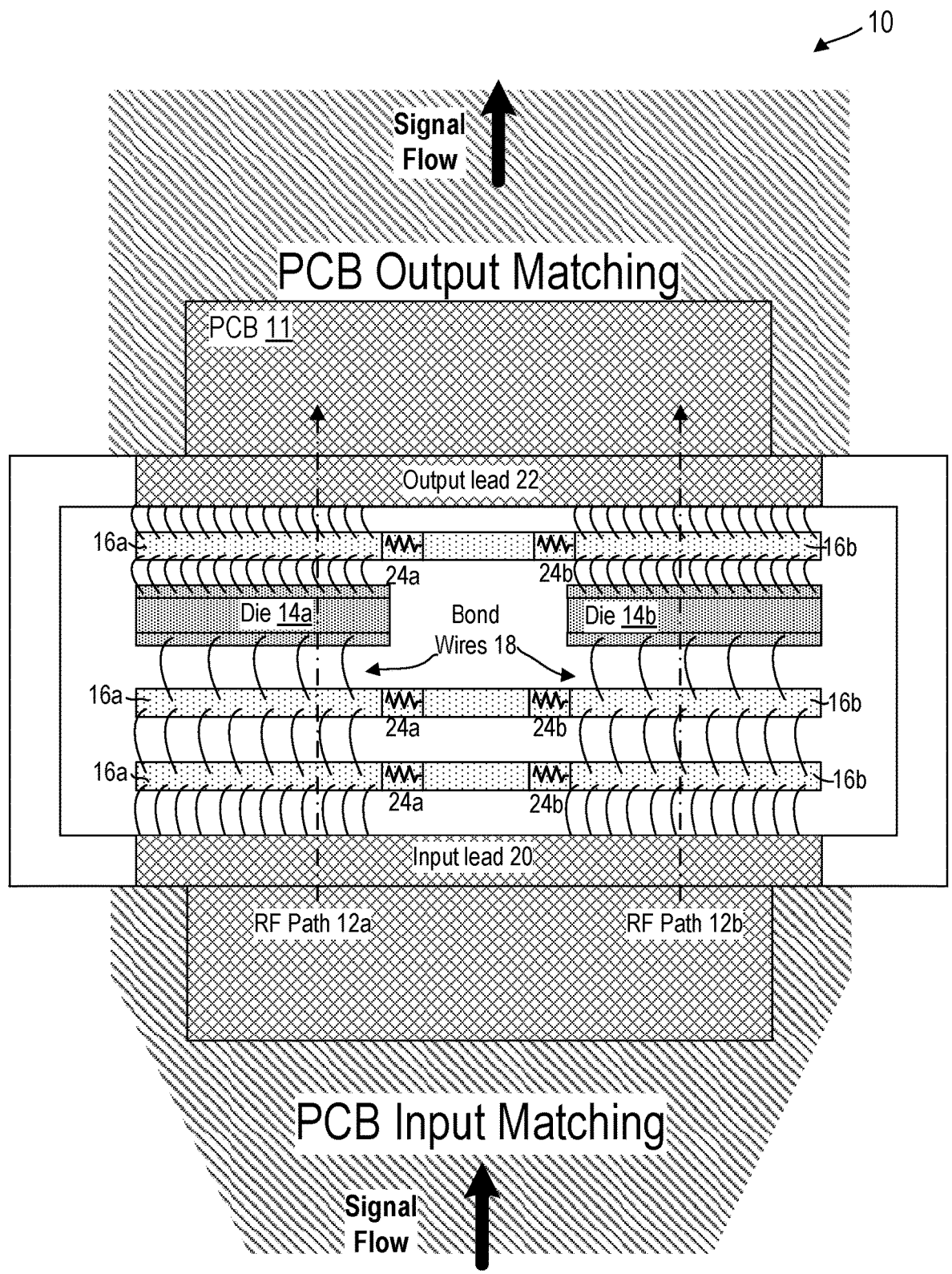
FIG. 15 shows another embodiment of the package configuration having impedance matching networks augmented by at least one resistor with an additional capacitance in accordance with the principles of the disclosure.
Figure 16:
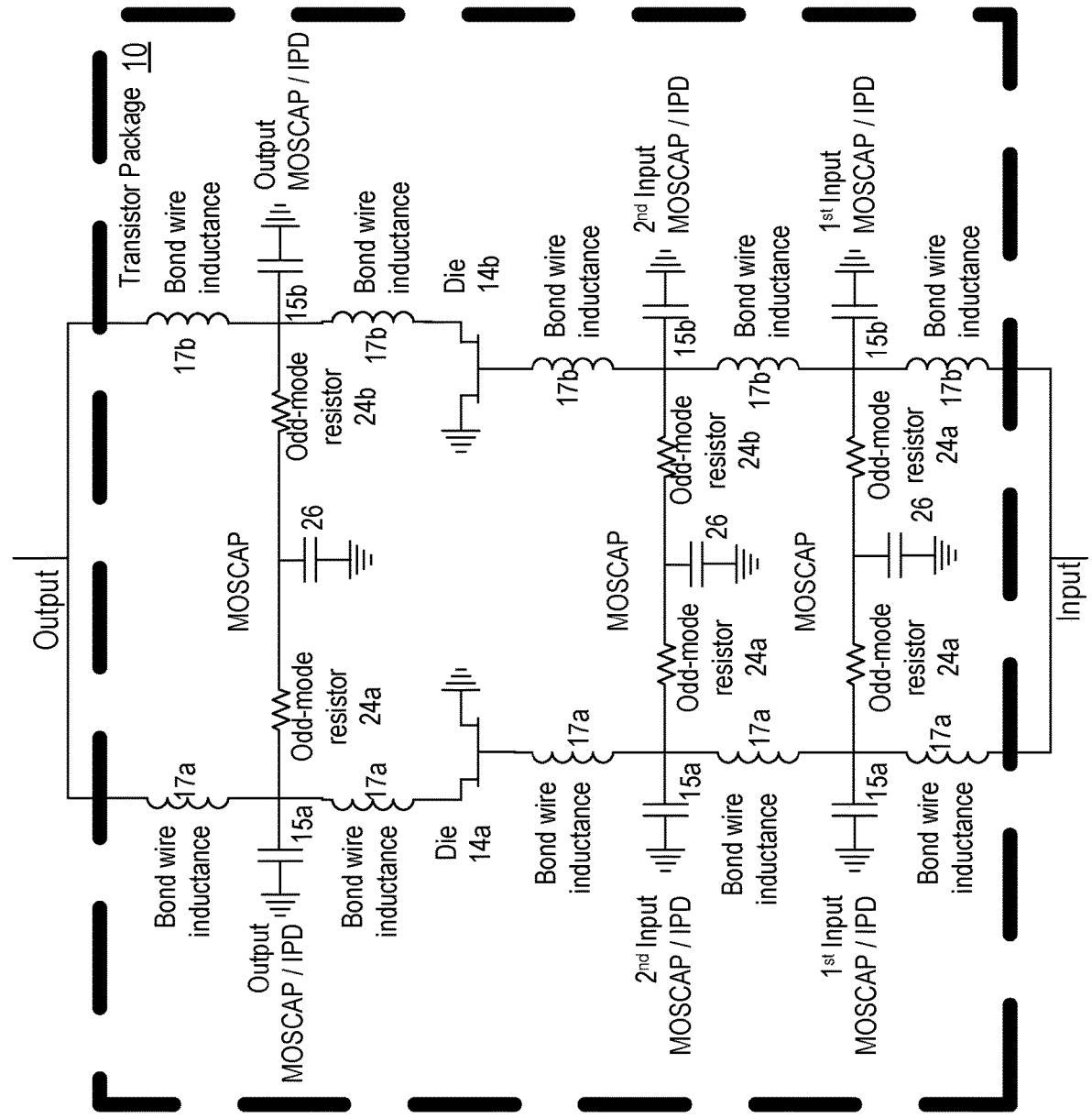
FIG. 16 is a circuit schematic view of the package configuration of FIG. 15 in accordance with the principles of the disclosure.

FIG. 15 shows an embodiment that does not use of bond wires 18 to connect neighboring impedance elements 16 by using a single longer impedance element 16, i.e., MOSCAP/MIMCAP/IPD, instead of using, for example, one or more transmission lines. The circuit schematic view of FIG. 15 is illustrated in FIG. 16. Referring back to FIG. 15, in this embodiment, the odd mode resistor 24 are built-in to and/or integrated into this longer impedance element 16. In one or more embodiments, the two sides of the resistors 24a and 24b are optionally connected through a common shunt capacitor 26. In one or more embodiments, impedance elements 16 may include at least one transmission line joining the RF paths 12. In one or more embodiments, impedance elements 16 may include at least one inductor joining the RF paths 12. In one or more embodiments, capacitor 26 may be omitted. The impedance elements 16 and resistors 24 are integrated on one or the same chip.

FIGS. 17-28 show examples of some impedance elements 16 (MOSCAP/MIMCAP/IPD) and their equivalent circuits (i.e., circuitry schematic views) in more detail. In each of the FIGS. 17-18, 21-22 and 25-26, an example impedance element 16 is shown, and in each of FIGS. 19-20, 23-24 and 27-28, how the impedance element 16 augments the odd mode damping resistor 24 is shown. Note that in FIGS. 19-20, 23-24 and 27-28, the RLC impedance network is symmetric with respect to a line passing between the first and second resistances. However, other non-symmetric embodiments are contemplated in accordance with the teachings of the disclosure.

Figure 18:
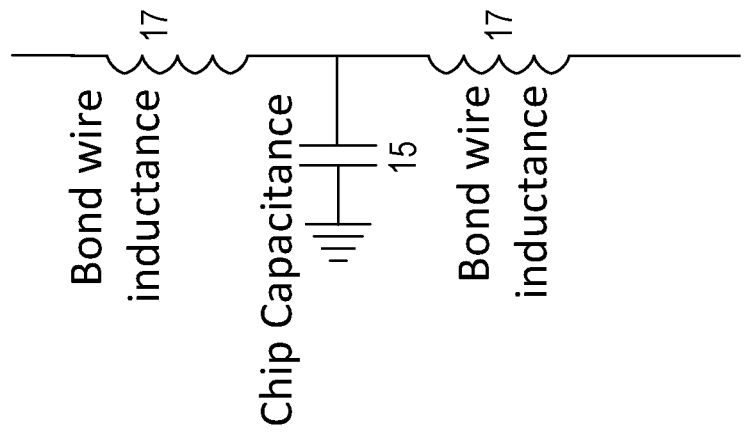
FIG. 18 is a circuit schematic view of FIG. 17 in accordance with the principles of the disclosure.
Figure 17:
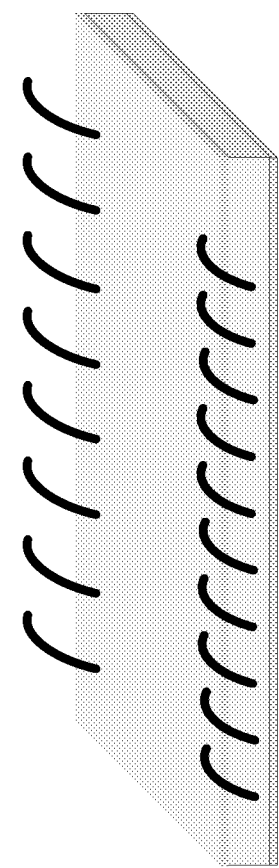
FIG. 17 is a physical view of a capacitor tuning element in accordance with the principles of the disclosure.
Figure 20:
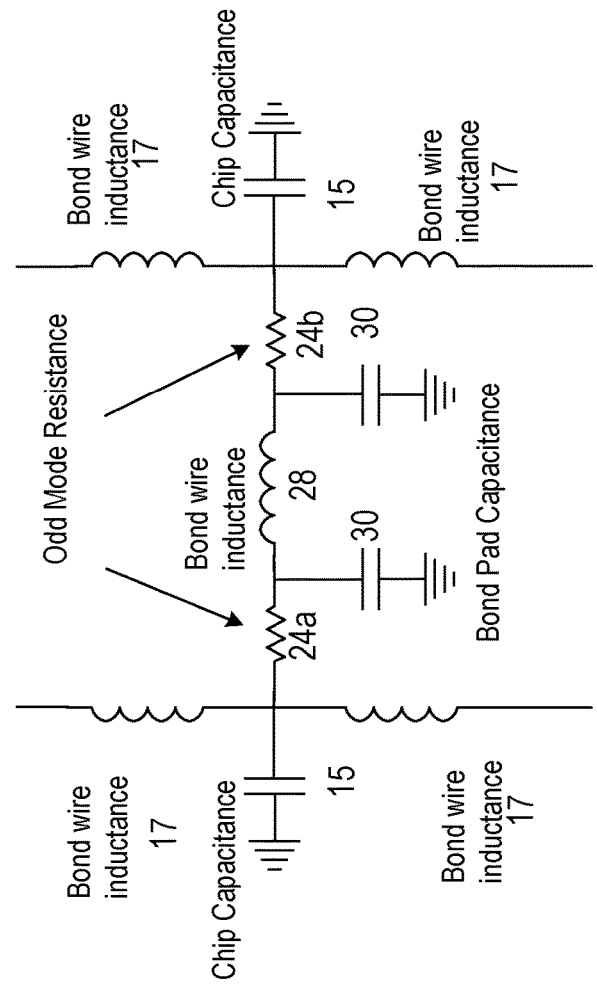
FIG. 20 is a circuit schematic view of the tuning element with the impedance network of FIG. 17 in accordance with the principles of the disclosure.

More specifically, FIG. 17-18 shows an embodiment of a capacitance 15 of impedance element 16 and FIG. 19-20 shows the equivalent circuit of the impedance element 16 within an RLC impedance network that includes the resistors 24a and 24b, the bond wire inductance 28, the capacitors 15, and the capacitors 30. In one or more embodiments described herein, optional odd mode resistors 24 may be included for one or more impedance elements 16.

Figure 22:
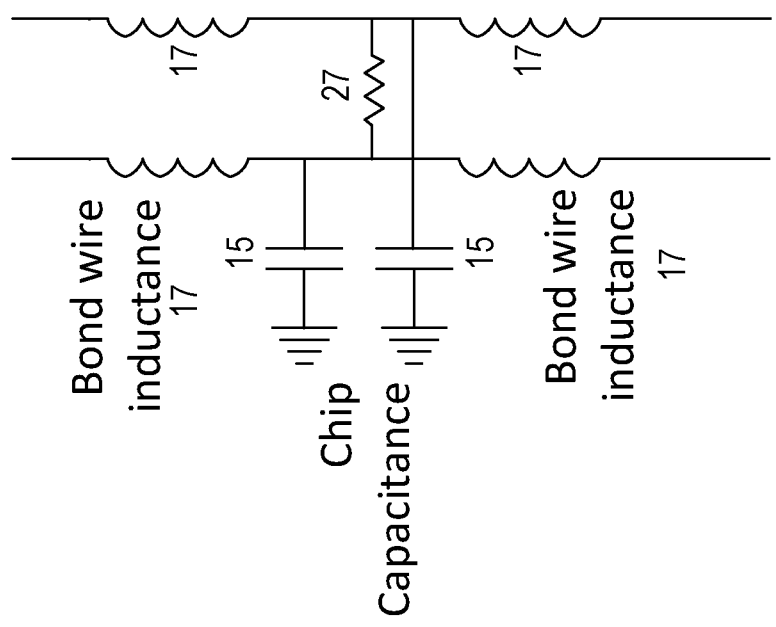
FIG. 22 is a circuit schematic view of the tuning element of FIG. 21.
Figure 21:
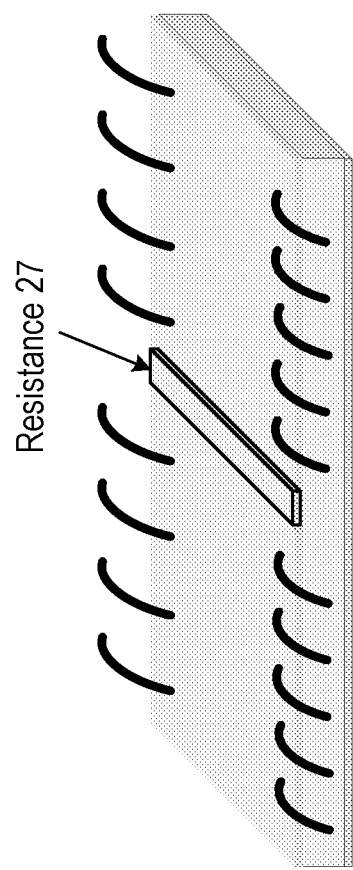
FIG. 21 shows a physical view of a tuning element having a capacitance and embedded resistor.
Figure 23:
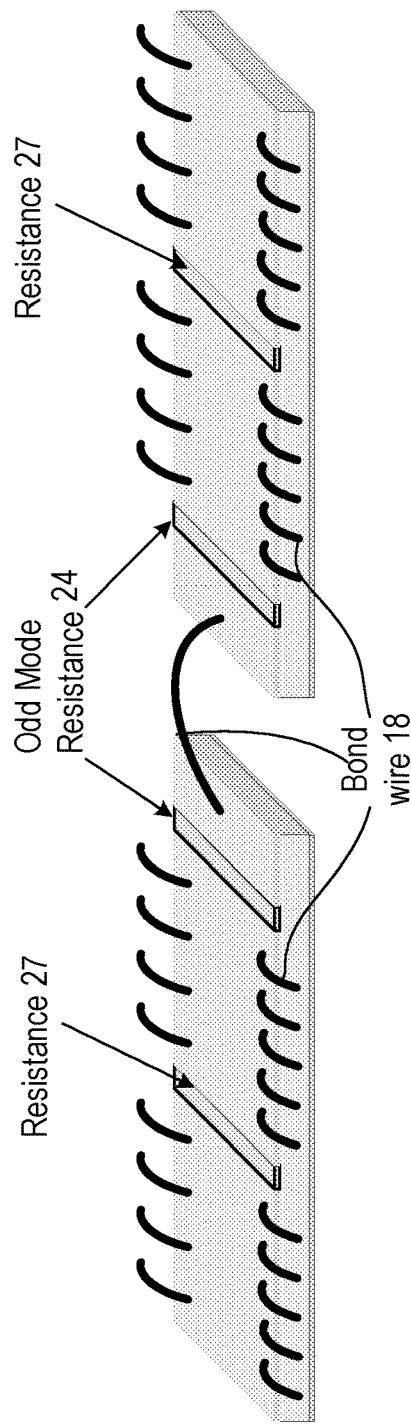
FIG. 23 shows a physical view of multiple tuning element of FIG. 21 that have been modified and incorporated within an impedance network in accordance with the principles of the disclosure.
Figure 24:
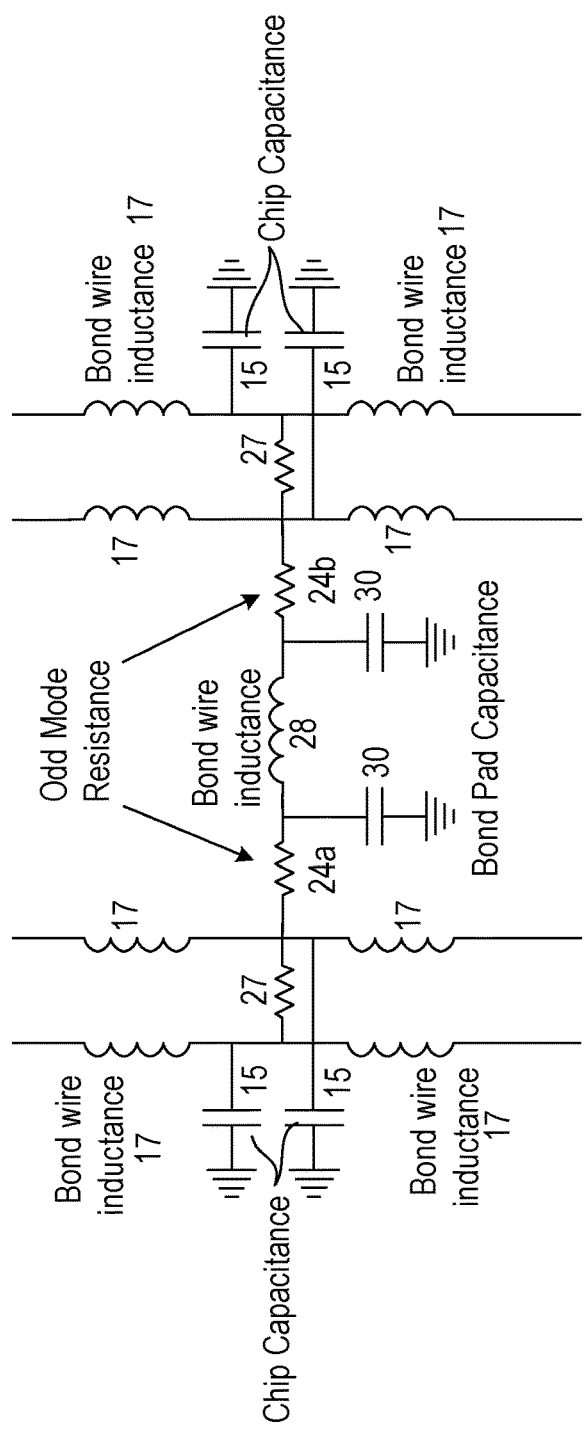
FIG. 24 is a circuit schematic view of the tuning element and impedance network of FIG. 23 in accordance with the principles of the disclosure.

FIGS. 21-22 shows a pair of capacitors 15 with an embedded resistor 27. This resistor 27 may be included in some embodiments to dampen odd mode signals that may exist from one RF path 12 to the other. However, on its own, the resistor 27 may not provide damping of odd mode signal components that exist between the RF paths. The impedance element 16 illustrated in FIG. 21 can modified in accordance with the teachings of the disclosure such as by adding odd mode resistance 24 (as illustrated in FIG. 23), thereby allowing for dampening of odd mode signal components. FIGS. 21-22 may be applicable to N RF paths with (N–1) resistors. FIGS. 23-24 shows the capacitors 15 with embedded resistor 27 within an RLC network that includes the resistances 24a and 24b, the bond wire inductance 28, capacitors 30 that may be provided by bond pad capacitance, and the resistor 27.

Figure 26:
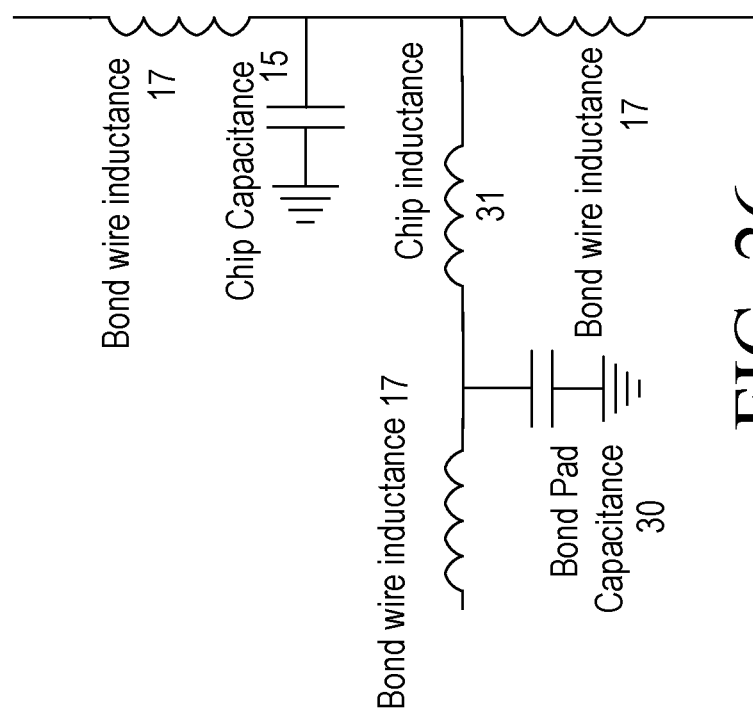
FIG. 26 is a circuit schematic view of the tuning element of FIG. 25 in accordance with the principles of the disclosure.
Figure 25:
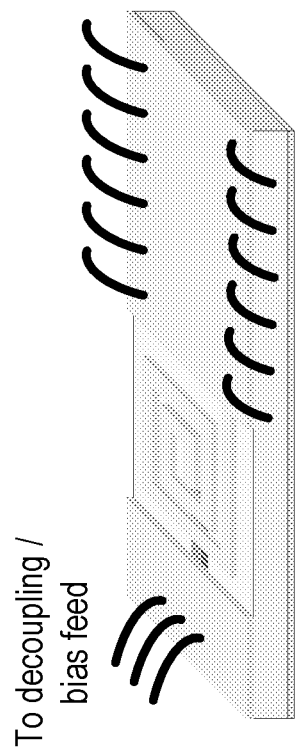
FIG. 25 shows a physical view of a tuning element with a shunt capacitor and inductor in accordance with the principles of the disclosure.
Figure 27:
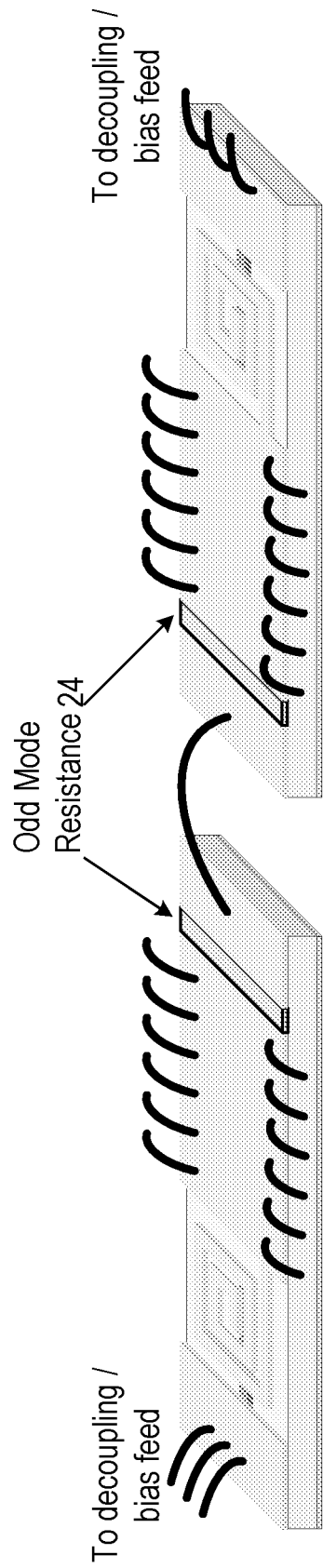
FIG. 27 shows a physical view of the tuning element of FIG. 25 incorporated within an impedance network in accordance with the principles of the disclosure.
Figure 28:
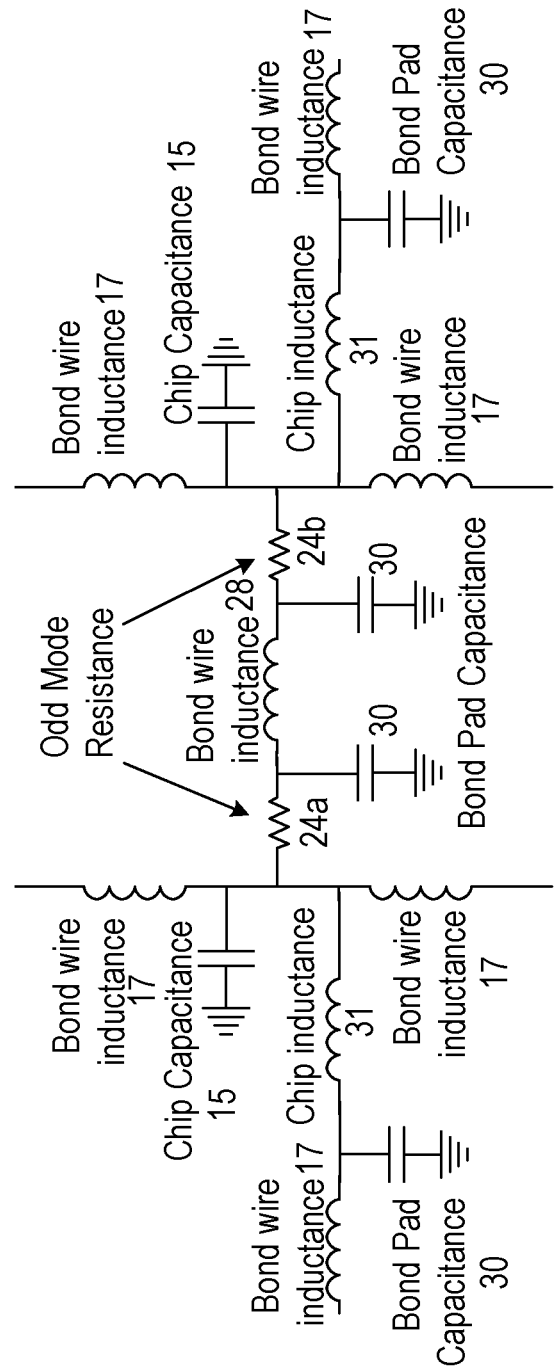
FIG. 28 is a circuit schematic view of the tuning element and impedance network of FIG. 27 in accordance with the principles of the disclosure.

FIGS. 25-26 shows an IPD with shunt capacitor 15 and an extra inductor-capacitor 31 connection to the IPD comprising a bond pad capacitance provided by capacitor 30 and a chip inductance 31, which form an inductor-capacitor pair. This extra connection may be used to provide baseband decoupling and/or bias. FIGS. 27-28 shows the elements of FIG. 27 within the RLC network that includes resistances 24a and 24b, bond wire inductance 28 and bond pad capacitors 30. In one or more embodiments, one or more configurations described herein may not implement/use one or more shunt capacitors.

These are just a few examples of impedance elements, i.e., tuning elements, into which the odd mode damping solution described herein can be incorporated. One or more embodiments operate to reduce or eliminate odd-mode oscillation in multi-die transistors. Some embodiments can be used with other odd-mode stabilization methods that may be available in the transistors. Some embodiments do not provide other stabilization methods other than those introduced herein.

Thus, according to one aspect, a transistor package 10 with odd mode signal suppression is provided. The transistor package 10 includes, in each of at least two RF paths 12, a transistor-carrying die 14 and at least one impedance element 16 separate from the transistor-carrying die 14. In addition, the transistor package 10 includes a circuit portion coupling a first impedance element 16 in one RF path 12 to a corresponding second impedance element 16 in the other RF path 12. The circuit portion has a first resistance 24a coupled to the first impedance element 16 and a second resistance 24b coupled to the second impedance element 16, the first resistance 24a coupled to the second resistance 24b to suppress odd mode signals.

According to this aspect, in some embodiments, an impedance element 16 includes a capacitance coupled to a ground of the transistor package 10. In some embodiments, the first resistance 24a is coupled to the second resistance 24b by an inductance 28 such as an inductance provided by bond wire 18. In some embodiments, a plurality of impedance elements 16 are arranged in pairs, one impedance element 16 in a pair being in one RF path 12 and another corresponding impedance element 16 in the pair being in the other RF path 12, the impedance elements 16 in a pair being coupled by the first and second resistances 24a and 24b. In some embodiments, the first and second resistances 24a and 24b are coupled to ground at a center point by a capacitor 26. In some embodiments, the first and second resistances 24a and 24b are coupled by an inductance 28 and/or bond wire 18, on each side of the inductance 28 there being capacitors 30 shunt to a ground of the transistor package 10, as illustrated in FIG. 28 for example. In some embodiments, one RF path 12 has an output and input that are separate from another output and input of the other RF path 12. In some embodiments, for each RF path 12, a second bond wire inductance is in parallel with an inductance 28 in series with the corresponding RF path 12. In some embodiments, for each RF path 12, a second bond pad capacitor 30 is coupled through a chip inductor 31 to an inductance 28 in series with the corresponding RF path, as illustrated in FIG. 26 for example. In some embodiments, the impedance elements 16 to which the first and second resistors 24a and 24b are coupled include one of a Metal Oxide Semiconductor Capacitor, MOSCAP, Metal Insulator Metal Capacitor, MIMCAP and an Integrated Passive Device (IPD).

According to another aspect, a power amplifier configured to suppress odd mode signals is provided. The power amplifier includes a transistor package 10 on a printed circuit board 11. The transistor package 10 includes, in a first RF, path 12, a first die 14 supporting a first transistor and, separate from the first die 14, a first impedance element 16 providing a first shunt capacitance 15 to a ground of the transistor package 10 and providing a first resistor 24a. The transistor package 10 includes, in a second RF path 12 in parallel with the first RF path 12, a second die 14 supporting a second transistor, and, separate from the second die 14, a second impedance element 16 providing a second shunt capacitance 15 to the ground of the transistor package 10 and providing a second resistor 24b coupled to the first resistor 24a. The first and second resistor 24a and 24b are configured to suppress odd mode signals in the power amplifier, as illustrated in FIG. 16 for example.

According to this aspect, in some embodiments, the first resistance 24a is coupled to the second resistance 24b by an inductance 28 such as a bond wire inductance 28. In some embodiments, on each side of the bond wire inductance 28 there is an additional shunt capacitor 30 to ground, as illustrated in FIG. 28 for example. In some embodiments, the first resistor 24a is coupled to an impedance network that includes the first impedance element 16 and an additional inductance-capacitance, LC, network. In some embodiments, the LC network includes a chip inductor 31 and a bond pad capacitor 30. In some embodiments, the first resistor 24a and the second resistor 24b are coupled at a point to which is coupled a third shunt capacitor 26 coupled to the ground of the transistor package 10, as illustrated in FIG. 16 for example. In some embodiments, the first resistor 24a and the second resistor 24b are in a resistance-inductance-capacitance, RLC, network that is symmetrical with respect to a line passing between the first and second resistors 24a and 24b. In some embodiments, an inductance 28 of the RLC network is a bond wire inductance 28, as illustrated in FIG. 20 for example. In some embodiments, an inductance 31 of the RLC network is a chip inductance, as illustrated in FIG. 26 for example. In some embodiments, the impedance elements to which the first and second resistors 24a and 24b are coupled include one of a Metal Oxide Semiconductor Capacitor, MOSCAP, Metal Insulator Metal Capacitor, MIMCAP and an Integrated Passive Device (IPD).

In one or more embodiments described herein the location and/or positioning of one or more impedance elements 16 can be varied. For example, one or more impedance elements 16 can be located and/or positioned at the output and/or the input of the transistor carrying die 14. In one or more examples, the transistor carrying die 14 and the impedance element 16 may be on the same transistor carrying die 14. In one or more examples, one or more impedance elements 16 are one or more flanges of the device, i.e., power amplifier. In one or more examples, the one or more impedance elements 16 are one or more transmission lines on the PCB 11.

In one or more embodiments described herein, the circuit portion connected at least two impedance elements by include at least one of: at least one resistor, at least one reactive element (inductor/capacitor) and at least one transmission line, as described herein. In one or more embodiments described herein, the coupling to two elements may be provided by one or more or an inductor, series capacitor, etc.

Figure 29:
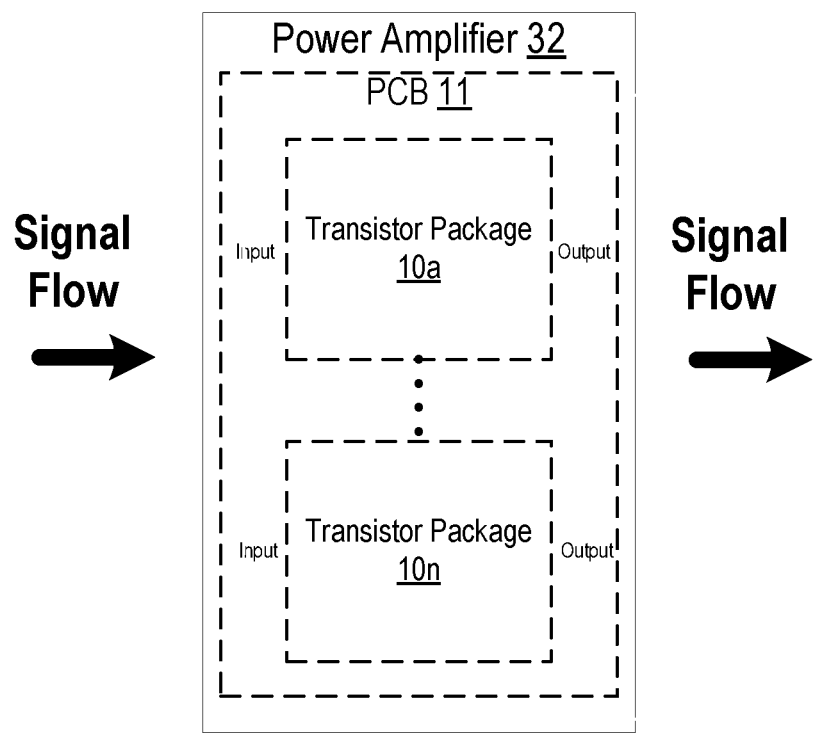
FIG. 29 is a block diagram of a power amplifier in accordance with the principles of the disclosure.

According to one aspect of the disclosure, a transistor package 10 for a power amplifier 32 is provided. The power amplifier 32 may include one or more transistor packages 10a-10n and one or more printed circuit boards 11 as illustrated in FIG. 29, among other power amplifier elements that are known in the art. In one or more embodiments, the inputs and/or outputs of one or more transistors packages 10a-10n may be combined. The transistor package 10 includes a plurality of radio frequency, RF, paths 12 that includes a first RF path 12 and second RF path 12. Each RF path 12 includes a transistor-carrying die 14 and at least one impedance element 16. The transistor package includes a circuit portion electrically coupling a first impedance element 16 in the first RF path 12 to a second impedance element 16 in the second RF path 12 where the circuit portion includes at least one resistor 24.

According to one or more embodiments of this aspect, the at least one resistor 24 is configured to suppress odd mode signal components associated with the first and second RF paths 12. According to one or more embodiments of this aspect, the at least one resistor 24 includes at least a first resistor 24 and a second resistor 24. The first resistor 24 is electrically coupled to the first impedance element 16. The second resistor 24 is electrically coupled to the second impedance element 16, and the first and second resistors 24 are electrically coupled to each other. According to one or more embodiments of this aspect, the at least one resistor 24 includes at least a first resistor 24 and a second resistor 24. The first resistor 24 is integrated with the first impedance element 16 and the second resistor 24 is integrated with the second impedance element 16, and the first and second resistors 24 are electrically coupled to each other.

According to one or more embodiments of this aspect, the circuit portion includes at least one of at least one reactive element and at least one transmission line. According to one or more embodiments of this aspect, the circuit portion includes an inductive element 18. The first resistor 24 is electrically coupled to the second resistor 24 by the inductive element 18. According to one or more embodiments of this aspect, the circuit portion electrically couples the first impedance element 16 in the first RF path 12 to the second impedance element 16 in the second RF path 12 using a bonding wire 18.

According to one or more embodiments of this aspect, the circuit portion includes a capacitor where the first resistor 24 and second resistor 24 are electrically coupled to ground by the capacitance. According to one or more embodiments of this aspect, the circuit portion includes a capacitor where the capacitor 26, 30 electrically couples the first impedance element 16 in the first RF path 12 to the second impedance element 16 in the second RF path 12. According to one or more embodiments of this aspect, the impedance element 16 is one of a Metal Oxide Semiconductor Capacitor, MOSCAP, Metal Insulator Metal Capacitor, MIMCAP, and an Integrated Passive Device, IPD.

According to one or more embodiments of this aspect, the first RF path 12 has an input and output that are separate from an input and output of the second RF path 12. According to one or more embodiments of this aspect, the at least one impedance element 16 corresponds to a plurality of impedance element 16. According to another aspect of the disclosure, a power amplifier 32 is provided. The power amplifier 32 includes a printed circuit board 11 and a transistor package 10 disposed on the printed circuit board 11. The transistor package 10 includes a first radio frequency, RF, path 12 including: a first transistor-carrying die 14 and at least a first impedance element 16. The transistor package includes a second RF path 12 including a second transistor-carrying die 14 and at least a second impedance element 16. The transistor package includes a circuit portion electrically coupling the first impedance element 16 in the first RF path 12 to the second impedance element 16 in the second RF path 12 where the circuit portion includes at least one resistor 24.

According to one or more embodiments of this aspect, the at least one resistor 24 is configured to suppress odd mode signal components associated with the first and second RF paths 12. According to one or more embodiments of this aspect, the at least one resistor 24 includes at least a first resistor 24 and a second resistor 24 where the first resistor 24 is electrically coupled to the first impedance element 16 and the second resistor 24 is electrically coupled to the second impedance element (16), and the first and second resistors 24 are electrically coupled to each other.

According to one or more embodiments of this aspect, the at least one resistor 24 includes at least a first resistor 24 and a second resistor 24 where the first resistor 24 is integrated with the first impedance element 16 and the second resistor 24 is integrated with the second impedance element 16, and the first and second resistors 24 are electrically coupled to each other.

According to one or more embodiments of this aspect, the circuit portion includes at least one of: at least one reactive element and at least one transmission line. According to one or more embodiments of this aspect, the circuit portion includes an inductive element 18 where the first resistor 24 is electrically coupled to the second resistor 24 by the inductive element 18. According to one or more embodiments of this aspect, the circuit portion electrically couples the first impedance element 16 in the first RF path 12 to the second impedance element 16 in the second RF path 12 using one or more bonding wires 18.

According to one or more embodiments of this aspect, the circuit portion includes a capacitor 26, 30 where the first resistor 24 and second resistor 24 are electrically coupled to ground by the capacitance. According to one or more embodiments of this aspect, the circuit portion includes a capacitor 26, 30 where the capacitor 26, 30 electrically couples the first impedance element 16 in the first RF path 12 to the second impedance element 16 in the second RF path 12. According to one or more embodiments of this aspect, the impedance element 16 is one of a Metal Oxide Semiconductor Capacitor, MOSCAP, Metal Insulator Metal Capacitor, MIMCAP, and an Integrated Passive Device, IPD.

According to one or more embodiments of this aspect, the first RF path 12 has an input and output that are separate from an input and output of the second RF path 12. According to one or more embodiments of this aspect, the at least one impedance element 16 corresponds to a plurality of impedance element 16.

According to another aspect of the disclosure, a power amplifier 32 is provided. The power amplifier 32 includes a printed circuit board 11 and a transistor package 10 disposed on the printed circuit board 11. The transistor package 10 includes a first radio frequency, RF, path 12 that includes a first transistor-carrying die 14 and at least a first impedance element 16 separate from the first transistor-carrying die 14. The transistor package includes a second RF path 12 that includes a second transistor-carrying die 14 and at least a second impedance element 16 separate from the second transistor-carrying die 14. The transistor package includes a circuit portion electrically coupling the first impedance element 16 in the first RF path 12 to the second impedance element 16 in the second RF path 12. The circuit portion includes at least one dampening resistor 24 configured to suppress odd mode signal components in the power amplifier 32. The first and second impedance elements 16 are one of a Metal Oxide Semiconductor Capacitor, MOSCAP, Metal Insulator Metal Capacitor, MIMCAP, and an Integrated Passive Device, IPD.

Some examples include:

Example A1. A transistor package 10 for a power amplifier, the transistor package comprising:
in each of a pair of radio frequency, RF, paths 12:
a transistor-carrying die 14; and
at least one impedance element 16 separate from the transistor-carrying die 14; and
a circuit portion coupling a first impedance element 16 in one RF path 12 to a corresponding second impedance element 16 in the other RF path 12, the circuit portion having a first resistance 24 coupled to the first impedance element 16 and a second resistance 24 coupled to the second impedance element 16, the first resistance 24 coupled to the second resistance 24 to suppress odd mode signals.

Example A2. The transistor package 10 of Example A1, wherein an impedance element 16 includes a capacitance 26 coupled to a ground of the transistor package 10.

Example A3. The transistor package 10 of Example A1, wherein the first resistance 24 is coupled to the second resistance 24 by an inductance 28.

Example A4. The transistor package 10 of Example A1, wherein a plurality of impedance elements 16 are arranged in pairs, one impedance element 16 in a pair being in one RF path 12 and another corresponding impedance element 16 in the pair being in the other RF path 12, the impedance elements 16 in a pair being coupled by the first and second resistances 24.

Example A5. The transistor package 10 of Example A4, wherein the first and second resistances 24 are coupled to ground at a center point by a capacitance 26.

Example A6. The transistor package 10 of Example A4, wherein the first and second resistances 24 are coupled by an inductance 28, on each side of the inductance 28 there being a capacitance shunt to a ground of the transistor package 10.

Example A7. The transistor package 10 of any of Examples A1 and A4, wherein one RF path 12 has an input and output that are separate from an input and output of the other RF path 12.

Example A8. The transistor package 10 of any of Examples A1, A4 and A7, wherein, for each RF path 12, a second bond wire inductance 28, 17 is in parallel in positioning but series in electrical configuration with an inductance in series with the corresponding RF path 12.

Example A9. The transistor package 10 of any of Examples A1, A4 and A7, wherein, for each RF path 12, a second bond pad capacitance 30 is coupled through a chip capacitance 15 to an inductance 28, 17 in series with the corresponding RF path 12.

Example A10. The transistor package 10 of Example A1, wherein the impedance elements 16 to which the first and second resistances 24 are coupled include one of a Metal Oxide Semiconductor Capacitor, MOSCAP, Metal Insulator Metal Capacitor, MIMCAP, and an Integrated Passive Device, IPD.

Example B1. A power amplifier 32, comprising:
a transistor package 10 on a printed circuit board 11, the transistor package 10 including:
in a first radio frequency, RF, path 12
a first die 14 supporting a first transistor; and
separate from the first die 14, a first impedance element 16 providing a first shunt capacitance to a ground of the transistor package 10 and providing a first resistance; and
in a second RF path 12 in parallel with the first RF path 12;
a second die 14 supporting a second transistor; and
separate from the second die 14, a second impedance element 16 providing a second shunt capacitance to the ground of the transistor package 10 and providing a second resistance 24 coupled to the first resistance 24; and
the first and second resistances 24 configured to suppress odd mode signals in the power amplifier 32.

Example B2. The power amplifier 32 of Example B1, wherein the first resistance 24 is coupled to the second resistance 24 by an inductance 28.

Example B3. The power amplifier 32 of Example B2, wherein, on each side of the inductance 28 there is an additional shunt capacitance to ground.

Example B4. The power amplifier 32 of any of Examples B1-B3, wherein the first resistance 24 is coupled to an impedance network that includes the first impedance element 16 and an additional inductance-capacitance, LC, network.

Example B5. The power amplifier 32 of Example B4, wherein the LC network includes a chip inductance 31 and a bond pad capacitance 30.

Example B6. The power amplifier 32 of Example B1, wherein the first resistance 24 and the second resistance 24 are coupled at a point to which is coupled a third shunt capacitance 26 coupled to the ground of the transistor package 10.

Example B7. The power amplifier 32 of any of Examples B1-B6, wherein the first resistance 24 and the second resistance 24 are in a resistance-inductance-capacitance, RLC, network that is symmetrical with respect to a line passing between the first and second resistances 24.

Example B8. The power amplifier 32 of Example B7, wherein an inductance of the RLC network is a bond wire inductance 28, 17.

Example B9. The power amplifier 32 of Example B7, wherein an inductance of the RLC network is a chip inductance 31.

Example B10. The power amplifier 32 of Example B1, wherein the impedance elements 16 to which the first and second resistances 24 are coupled include one of a Metal Oxide Semiconductor Capacitor, MOSCAP, Metal Insulator Metal Capacitor, MIMCAP, and an Integrated Passive Device, IPD.

Abbreviations that may be used in the preceding description include:

| Abbreviation | Explanation |
|---|---|
| DC | Direct Current |
| IPD | Integrated Passive Device |
| MOSCAP | Metal Oxide Semiconductor Capacitor |
| PA | Power Amplifier |
| PCB | Printed Circuit Board |
| RF | Radio Frequency |

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A transistor package for a power amplifier, the transistor package comprising:
   a first RF path and a second RF path, the first path including:
      a first transistor-carrying die; and
      at least a first impedance element;
   the second RF path including:
      a second transistor-carrying die; and
      at least a second impedance element; and
   a circuit portion electrically coupling the first impedance element in the first RF path to the second impedance element in the second RF path, the circuit portion including at least a first resistor and a second resistor, the first resistor being electrically coupled to the first impedance element, the second resistor being electrically coupled to the second impedance element, and the first and second resistors being electrically coupled to each other by at least an inductive element.

2. The transistor package of claim 1, wherein the first resistor and the second resistor are configured to suppress odd mode signal components associated with the first and second RF paths.

3. The transistor package of claim 1, wherein the first resistor is integrated with the first impedance element, and the second resistor is integrated with the second impedance element.

4. The transistor package of claim 1, wherein the circuit portion includes at least one of:
   at least one reactive element; and
   at least one transmission line.

5. The transistor package of claim 1, wherein the inductive element includes at least one bonding wire.

6. The transistor package of claim 1, wherein the circuit portion includes a capacitor, the first resistor and the second resistor being electrically coupled to ground by the capacitor.

7. The transistor package of claim 1, wherein the circuit portion includes a capacitor, the capacitor electrically coupling the first impedance element in the first RF path to the second impedance element in the second RF path.

8. The transistor package of claim 1, wherein each of the first impedance element and the second impedance element is one of a Metal Oxide Semiconductor Capacitor, MOSCAP, Metal Insulator Metal Capacitor, MIMCAP, and an Integrated Passive Device, IPD.

9. The transistor package of claim 1, wherein the first RF path has a first input and a first output that are separate from a second input and a second output of the second RF path.

10. The transistor package of claim 1, wherein each of the first and second impedance elements corresponds to a plurality of impedance elements.

11. The transistor package of claim 1, further comprising at least one RF path in addition to the first and second RF paths.

12. A power amplifier, comprising:
   a printed circuit board; and
   a transistor package disposed on the printed circuit board, the transistor package including:
      a first radio frequency, RF, path including:
         a first transistor-carrying die; and
         at least a first impedance element;
      a second RF path including:
         a second transistor-carrying die; and
         at least a second impedance element; and
      a circuit portion electrically coupling the first impedance element in the first RF path to the second impedance element in the second RF path, the circuit portion including at least a first resistor and a second resistor, the first resistor being electrically coupled to the first impedance element, the second resistor being electrically coupled to the second impedance element, and the first and second resistors being electrically coupled to each other by at least an inductive element.

13. The power amplifier of claim 12, wherein the first resistor and the second resistor are configured to suppress odd mode signal components associated with the first and second RF paths.

14. The power amplifier of claim 12, wherein the first resistor is integrated with the first impedance element, and the second resistor is integrated with the second impedance element.

15. The power amplifier of claim 12, wherein the circuit portion includes at least one of:
   at least one reactive element; and
   at least one transmission line.

16. The power amplifier of claim 12, wherein the inductive element includes at least one bonding wire.

17. The power amplifier of claim 12, wherein the circuit portion includes a capacitor, the first resistor and the second resistor being electrically coupled to ground by the capacitor.

18. The power amplifier of claim 12, wherein the circuit portion includes a capacitor, the capacitor electrically coupling the first impedance element in the first RF path to the second impedance element in the second RF path.

19. The power amplifier of claim 12, wherein each of the first the impedance element and the second impedance element is one of a Metal Oxide Semiconductor Capacitor, MOSCAP, Metal Insulator Metal Capacitor, MIMCAP, and an Integrated Passive Device, IPD.

20. The power amplifier of claim 12, wherein the first RF path has a first input and a first output that are separate from a second input and a second output of the second RF path.

21. The power amplifier of claim 12, wherein each of the first and second impedance elements corresponds to a plurality of impedance elements.

22. A power amplifier, comprising:
- a printed circuit board;
- a transistor package disposed on the printed circuit board, the transistor package including:
- a first radio frequency, RF, path including:
  - a first transistor-carrying die; and
  - at least a first impedance element separate from the first transistor-carrying die;
- a second RF path including:
  - a second transistor-carrying die; and
  - at least a second impedance element separate from the second transistor-carrying die;
- a circuit portion electrically coupling the first impedance element in the first RF path to the second impedance element in the second RF path, the circuit portion including at least one dampening resistor configured to suppress odd mode signal components in the power amplifier; and
- the first and second impedance elements being one of a Metal Oxide Semiconductor Capacitor, MOSCAP, Metal Insulator Metal Capacitor, MIMCAP, and an Integrated Passive Device, IPD.

* * * * *